United States Patent
Yamada et al.

(10) Patent No.: US 12,306,115 B2
(45) Date of Patent: May 20, 2025

(54) SENSOR APPARATUS AND WATER AMOUNT MEASUREMENT APPARATUS

(71) Applicants: Sony Group Corporation, Tokyo (JP); Sony Semiconductor Solutions Corporation, Kanagawa (JP)

(72) Inventors: Atsushi Yamada, Tokyo (JP); Sachio Iida, Kanagawa (JP); Takuya Ichihara, Kanagawa (JP); Toshiyuki Hiroi, Tokyo (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 300 days.

(21) Appl. No.: 17/770,692

(22) PCT Filed: Oct. 19, 2020

(86) PCT No.: PCT/JP2020/039209
§ 371 (c)(1),
(2) Date: Apr. 21, 2022

(87) PCT Pub. No.: WO2021/085198
PCT Pub. Date: May 6, 2021

(65) Prior Publication Data
US 2023/0003668 A1    Jan. 5, 2023

(30) Foreign Application Priority Data
Oct. 28, 2019    (JP) ................. 2019-195614

(51) Int. Cl.
*G01R 27/32*    (2006.01)
*G01N 22/04*    (2006.01)
*G01R 27/26*    (2006.01)

(52) U.S. Cl.
CPC ........... *G01N 22/04* (2013.01); *G01R 27/267* (2013.01); *G01N 2223/616* (2013.01)

(58) Field of Classification Search
CPC .. G01R 27/22; G01R 27/267; G01R 27/2623; G01R 27/2676; G01R 29/0878;
(Continued)

(56) References Cited

U.S. PATENT DOCUMENTS 4,614,870 A * 9/1986 Morrison ............... G01N 23/06
378/53
9,217,809 B2 * 12/2015 Simon ....................... G01V 3/28
(Continued)

FOREIGN PATENT DOCUMENTS

JP    H10-090201 A    4/1998
JP    H10142169 A    5/1998
(Continued)

OTHER PUBLICATIONS

International Search Report issued in International Patent Application No. PCT/JP2020/039209 on Jan. 12, 2021 and English translation of same. 5 pages.

(Continued)

*Primary Examiner* — Thang X Le
(74) *Attorney, Agent, or Firm* — K&L Gates LLP

(57) ABSTRACT

A sensor apparatus includes a sensor head and a measurement unit. The sensor head includes a first probe and a second probe. The first probe includes a first tiny antenna section for transmission and a second tiny antenna section for transmission. The second probe is arranged at a predetermined distance from the first probe, and includes a first tiny antenna section for reception and a second tiny antenna section for reception. The measurement unit generates a measurement signal that includes information regarding characteristics of a propagation of an electromagnetic wave
(Continued)

in a medium between the first tiny antenna section for transmission and the first tiny antenna section for reception, and information regarding characteristics of the propagation of the electromagnetic wave in the medium between the second tiny antenna section for transmission and the second tiny antenna section for reception. The first probe and the second probe have different probe lengths, or a distance between the first tiny antenna section for transmission and the first tiny antenna section for reception, and a distance between the second tiny antenna section for transmission and the second tiny antenna section for reception are different from each other.

14 Claims, 17 Drawing Sheets

(58) Field of Classification Search
CPC ......... G01N 2223/66; G01N 2223/616; G01N 2223/618; G01N 2223/635; G01N 2223/652; G01N 2223/245; G01N 22/04
See application file for complete search history.

(56) References Cited

U.S. PATENT DOCUMENTS

| | | |
|---|---|---|
| 2013/0146756 A1 | 6/2013 | Schmidt |
| 2018/0031505 A1* | 2/2018 | Diez Garcia ...... G01N 33/2847 |
| 2018/0224382 A1 | 8/2018 | Golombek |
| 2019/0187072 A1* | 6/2019 | Ramzan ............. G01R 27/2623 |
| 2019/0219523 A1 | 7/2019 | Annan |
| 2020/0182906 A1 | 6/2020 | Yamada et al. |
| 2021/0239641 A1* | 8/2021 | Jung .................... G01N 27/228 |
| 2021/0333140 A1* | 10/2021 | Cerutti .................... G01F 23/24 |
| 2022/0205931 A1* | 6/2022 | Iida ........................ G01N 22/04 |

FOREIGN PATENT DOCUMENTS

| | | | |
|---|---|---|---|
| JP | 2006-133088 A | | 5/2006 |
| JP | 2010-071887 A | | 4/2010 |
| JP | 2018-179823 A | | 11/2018 |
| JP | WO2018221051 | * | 12/2018 |
| WO | WO2018221051 A1 | | 12/2018 |
| WO | WO-2020156713 A1 | | 8/2020 |

OTHER PUBLICATIONS

Written Opinion issued in International Patent Application No. PCT/JP2020/039209 on Jan. 12, 2021. 4 pages.

* cited by examiner

SENSOR APPARATUS AND WATER AMOUNT MEASUREMENT APPARATUS

TECHNICAL FIELD

The present technology relates to a sensor apparatus and a water amount measurement apparatus that are used to measure a water amount in a medium such as soil.

BACKGROUND ART

Time-domain reflectometry (TDR) is known as a method for measuring a water amount in a medium. This method includes measuring relative permittivity on the basis of the behavior of a high-frequency wave that travels back and forth between measurement probes. Specifically, this method includes transmitting an electromagnetic wave along a metallic probe embedded in a medium, and calculating a water amount in the medium from relative permittivity measured on the basis of a reflection response of the electromagnetic wave.

There is a problem in which, since the TDR measures relative permittivity using the characteristics of a propagation of an electromagnetic wave in the vicinity of a probe in a medium, a gap produced in the vicinity of the probe has a great impact on the measurement, and thus it is difficult to measure relative permittivity correctly. In order to solve the problem described above, a technology is disclosed that measures, using two probes that respectively serve as a transmission-side probe and a reception-side probe, relative permittivity of a medium between the probes, the two probes each including a tiny opening for an electromagnetic wave, the two probes being situated at a certain distance from each other (for example, refer to Patent Literature 1).

CITATION LIST

Patent Literature

Patent Literature 1: WO2018/221051

DISCLOSURE OF INVENTION

Technical Problem

In this case, the gap produced in the vicinity of the probe is smaller than the distance between the probes, and thus does not have a great impact on a result of the measurement. This results in being able to calculate relative permittivity (proportional to a water amount) with a reduced error. When a plurality of tiny openings is provided to each probe, this makes it possible to measure a water amount at a plurality of locations in the medium at the same time.

When a plurality of tiny openings is provided to each probe, propagation paths for a plurality of electromagnetic waves are formed. On the other hand, it has turned out that, when a measurement distance between a certain tiny opening provided to the transmission-side probe and a certain tiny opening provided to the reception-side probe, and a measurement distance between another tiny opening provided to the transmission-side probe and another tiny opening provided to the reception-side probe (total lengths of signal transmission paths) are equal, paths unintentionally have equal propagation lengths. This results in causing noise, and thus in causing an error in measurement.

In view of the circumstances described above, it is an object of the present technology to provide a sensor apparatus and a water amount measurement apparatus that make it possible to reduce an error in measurement, and to improve the accuracy in the measurement of relative permittivity of a medium or a water amount in the medium.

Solution to Problem

A sensor apparatus according to an embodiment of the present technology includes a sensor head and a measurement unit.

The sensor head includes a first probe and a second probe. The first probe includes a first tiny antenna section for transmission and a second tiny antenna section for transmission. The second probe is arranged at a predetermined distance from the first probe, and includes a first tiny antenna section for reception and a second tiny antenna section for reception.

The measurement unit includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception.

The first probe and the second probe have different probe lengths. Alternatively, a distance between the first tiny antenna section for transmission and the first tiny antenna section for reception, and a distance between the second tiny antenna section for transmission and the second tiny antenna section for reception are different from each other.

The first and second probes may each include a coaxial cable that includes a core wire portion and a shield portion. The first tiny antenna section for transmission, the second tiny antenna section for transmission, the first tiny antenna section for reception, and the second tiny antenna section for reception each include an opening that is provided to a portion of the shield portion.

The second probe may include a bent portion that is provided between the first tiny antenna section for reception and the second tiny antenna section for reception.

The first probe may include a fold portion. The first tiny antenna section for transmission is provided to the fold portion, and the second tiny antenna section for transmission is provided to a tip of the first probe.

The sensor head may further include a support that supports the first probe and the second probe. The first probe is supported by the support in a state in which the first probe is not parallel to the second probe.

The first probe may include a third tiny antenna section for transmission, and the second probe may include a third tiny antenna section for transmission. The measurement unit generates the measurement signal further including information regarding characteristics of the propagation of the electromagnetic wave in the medium between the third tiny antenna section for transmission and the third tiny antenna section for reception.

The sensor head may include a first signal-transmission path and a second signal-transmission path, the first signal-transmission path passing between the first tiny antenna section for transmission and the first tiny antenna section for reception, or between the first tiny antenna section for transmission and the second tiny antenna section for reception, the second signal-transmission path passing between the second tiny antenna section for transmission and the first tiny antenna section for reception, or between the second tiny antenna section for transmission and the second tiny antenna section for reception, and each of a difference in path length between the first signal-transmission paths, a difference in path length between the second signal-transmission paths, and a difference in path length between the first signal-transmission path and the second signal-transmission path, may be greater than or equal to a predetermined effective wavelength.

Arrangement of the first and second tiny antenna sections for transmission, and arrangement of the first and second tiny antenna sections for reception may be asymmetric with respect to each other.

A water amount measurement apparatus according to an embodiment of the present technology includes a sensor head, a measurement unit, and a signal processing unit.

The sensor head includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe.

The measurement unit includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception.

The signal processing unit measures a water amount in the medium on the basis of the measurement signal.

The first probe and the second probe have different probe lengths. Alternatively, a distance between the first tiny antenna section for transmission and the first tiny antenna section for reception, and a distance between the second tiny antenna section for transmission and the second tiny antenna section for reception are different from each other.

The signal processing unit may include a delay time calculator that calculates, on the basis of the measurement signal, a delay time of the propagation of the electromagnetic wave between the first and second probes; a relative permittivity calculator that calculates relative permittivity of the medium on the basis of the propagation delay time; and a water amount calculator that calculates a water amount in the medium on the basis of the relative permittivity.

MODE(S) FOR CARRYING OUT THE INVENTION

Embodiments according to the present technology will now be described below with reference to the drawings.

<Basic Configuration>

First, a basic configuration of a water amount measurement apparatus according to the present embodiment is described.

Figure 1:
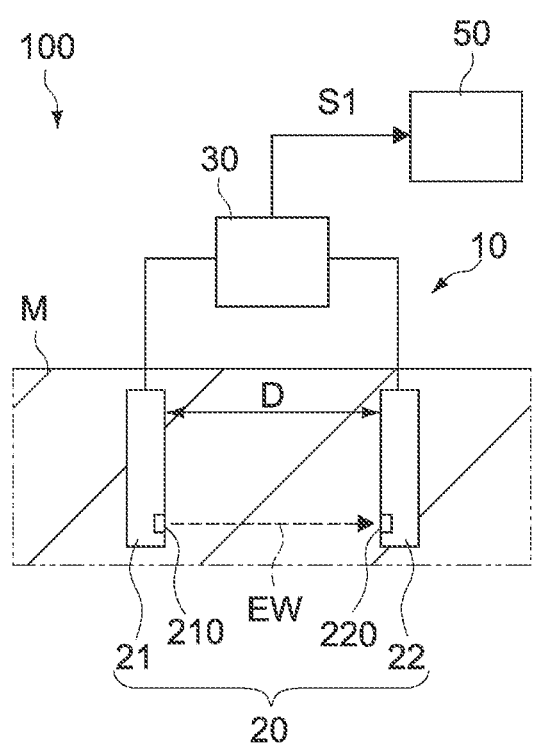
FIG. 1 is a schematic configurative diagram illustrating a basic configuration of a water amount measurement apparatus according to embodiments of the present technology.
Figure 2:
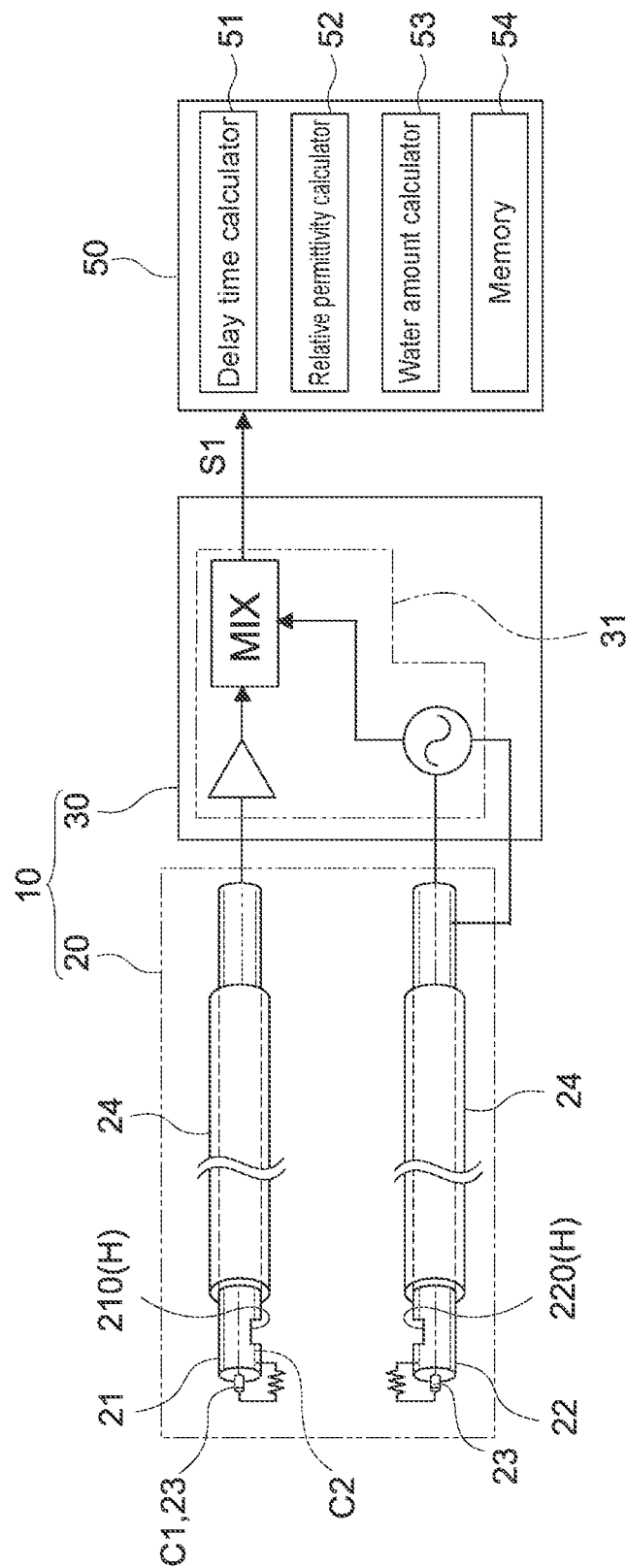
FIG. 2 is a block diagram illustrating a configuration of the water amount measurement apparatus.

FIG. 1 schematically illustrates a configuration of a water amount measurement apparatus 100. FIG. 2 is a block diagram schematically illustrating a configuration of the water amount measurement apparatus 100.

[Water Amount Measurement Apparatus]

The water amount measurement apparatus 100 includes a sensor apparatus 10 and a signal processing unit 50. Here, an example of applying the present technology to the measurement of a water amount in soil where crops will grow, is described.

The sensor apparatus 10 acquires the characteristics of a propagation of an electromagnetic wave in a medium (soil) M, and generates a measurement signal S1 used to calculate relative permittivity of the medium M. The signal processing unit 50 receives the measurement signal S1 from the sensor apparatus 10, and calculates a water amount in the medium M on the basis of the measurement signal S1.

The sensor apparatus 10 includes a sensor head 20 and a measurement unit 30.

(Sensor Head)

The sensor head 20 includes a transmission probe 21 (a first probe) and a reception probe 22 (a second probe). The sensor head 20 includes tiny antenna sections 210 and 220 that are arranged in a medium M such as soil and enable transmission and reception of an electromagnetic wave EW of a predetermined frequency between the transmission probe 21 and the reception probe 22.

The transmission probe 21 and the reception probe 22 are embedded in the medium M in a generally vertical pose such that they are situated at a distance D from each other to face each other. The transmission probe 21 and the reception probe 22 each include a coaxial cable that includes a core wire portion C1 and a shield portion C2. The thickness and the length of the cable are not particularly limited, and the cable may have any thickness and any length. For example, the cable can be easily inserted into soil when the cable has a thickness (a diameter) of from 2 mm to 6 mm.

The core wire portion C1 includes a copper wire, and the shield portion C2 includes a copper pipe, but the shield portion C2 may include a mesh of copper wires. The outer surface of the shield portion C2 is covered with a protection layer made of an insulating material, although this is not illustrated.

The transmission probe 21 is connected to an output terminal 34 of the measurement unit 30 (refer to FIG. 3), and transmits a transmission signal from the measurement unit 30 to the tiny antenna section 210. The tiny antenna section 210 is provided on a tip (an end) 23 of the transmission probe 21 or near the tip of the transmission probe 21, and transmits an electromagnetic wave EW corresponding to the transmission signal to the reception probe 22.

The reception probe 22 is connected to an input terminal 35 of the measurement unit 30 (refer to FIG. 3), receives the electromagnetic wave EW using the tiny antenna section 220, and inputs a reception signal to the measurement unit 30. The antenna section 220 is provided on a tip (an end) of the transmission probe 22 or near the tip of the transmission probe 22 such that the tiny antenna section 220 faces the tiny antenna section 210 of the transmission probe 21. The antenna sections 210 and 220 are not limited to respectively being provided on the tips 23 of the probes 21 and 22, and may be respectively provided at any locations such as central locations of the probes 21 and 22.

The tiny antenna sections 210 and 220 are used to locally transmit and receive an electromagnetic wave EW at respective predetermined locations in the probes 21 and 22, and, typically, the tiny antenna sections 210 and 220 are each formed to be sufficiently small in size to not resonate the respective probes 21 and 22. This makes it possible to prevent the measurement accuracy from being decreased due to resonances of the probes 21 and 22.

The tiny antenna sections 210 and 220 each include an opening H provided to a portion of the shield portion C2 (refer to FIG. 2). In other words, the probes 21 and 22 each include a leakage coaxial antenna, the leakage coaxial antennas of the probes 21 and 22 respectively including the tiny antenna sections 210 and 220 serving as radio wave leaking sections.

The opening H has an opening shape of, for example, a rectangle, a circle, an ellipse, or an oval, and, typically, the opening H is formed to have an oval shape, the oval shapes of the openings H of the tiny antenna sections 210 and 220 respectively having long axes in longitudinal directions of the probes 21 and 22. The long axis of the opening H can be set as appropriate according to the wavelength of an electromagnetic wave EW to be used. For example, when the wavelength of the electromagnetic wave EW is from 500 MHz to 8 GHz, the length of the long axis of the opening H (a Z axis) is from about 5 mm to about 15 mm.

The transmission probe 21 and the reception probe 22 may each include an end resistance at the tip 23. The end resistance is electrically connected between an end of the core wire portion C1 and the shield portion C2. This prevents undesired reflections of a transmission signal and a reception signal at the ends of probes.

It is favorable that the tips 23 of the transmission probe 21 and the reception probe 22 respectively be covered with electromagnetic-wave-transmitting protection members (of which an illustration is omitted) that respectively cover the tiny antenna sections 210 and 220.

The transmission probe 21 and the reception probe 22 each further include a sleeve 24 that includes an electromagnetic wave absorption material. The sleeve 24 covers an outer peripheral surface around the tiny antenna section 210, 220 (the opening H) of the probe 21, 22. The sleeves 24 of the probes 21 and 22 prevent a transmission signal and a reception signal from being leaked from regions other than the openings H.

Ferrite is primarily used as the electromagnetic wave absorption material included in the sleeve 24. Without being limited thereto, any other high permeability material such as sendust or permalloy may be used according to, for example, a frequency of the electromagnetic wave EW. The sleeve 24 may be omitted as necessary, or may be provided only to one of the probes 21 and 22.

The magnitude of the distance D between the transmission probe 21 and the reception probe 22 is not particularly limited, and is, for example, from 20 mm to 100 mm. If the distance D is larger than 100 mm, there will be an increase in the attenuation of the electromagnetic wave EW propagating through the medium M, and this may result in being unable to obtain a sufficient reception intensity. On the other hand, if the distance D is smaller than 20 mm, there will be a technical difficulty in performing observation. Further, if the distance D is made smaller, a gap formed in the vicinity of the probe 21, 22 will have a great impact, and this may result in being unable to measure relative permittivity or a water amount correctly.

The gap is an air space formed between the medium M and the probe 21, 22, and is formed when, for example, the probe 21, 22 is moved in the medium M upon embedding the probe 21, 22 in the medium M from the surface of the medium M. As described later, it is favorable that the size of a gap (the thickness of an air space) be as small as possible in order to measure relative permittivity of the medium M or a water amount in the medium M with a high degree of accuracy, but a gap of about 1 mm may typically be produced.

(Measurement Unit)

Figure 3:
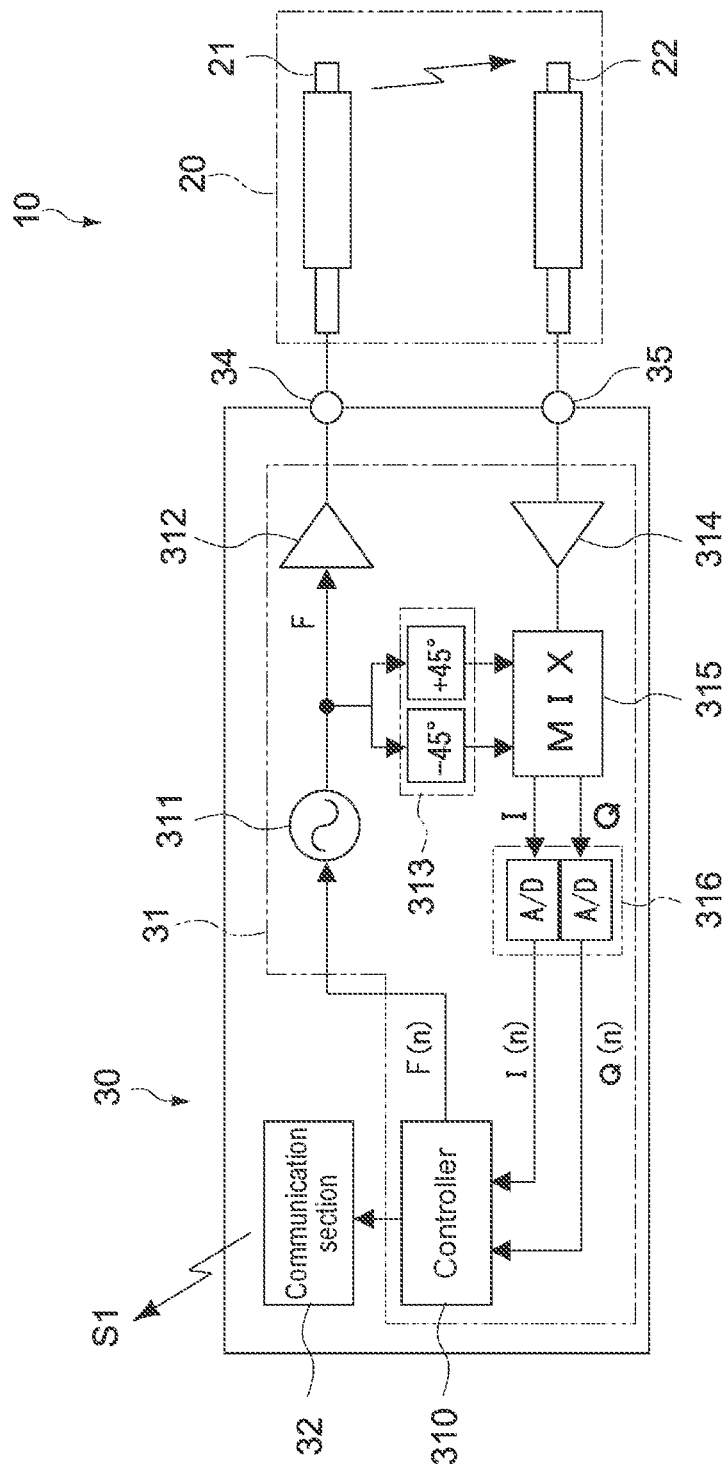
FIG. 3 is a block diagram illustrating a configuration of a measurement unit in the water amount measurement apparatus.

FIG. 3 is a block diagram illustrating a configuration of the measurement unit 30.

The measurement unit 30 includes a signal generator 31 and a communication section 32. Typically, the measurement unit 30 includes a network analyzer.

The signal generator 31 includes, for example, a controller 310, a signal creating section (an oscillator) 311, amplifiers 312 and 314, a phase shifter 313, a mixer 315, and an AD converter 316. The signal generator 31 generates a measurement signal S1 that includes information regarding the characteristics of a propagation of the electromagnetic wave EW in the medium M between the tiny antenna section 210 of the transmission probe 21 and the tiny antenna section 220 of the reception probe 22.

The controller 310 includes a computer that includes, for example, a central processing unit (CPU) and a memory, and controls respective structural elements of the measurement unit 30, where examples of the structural element include the signal creating section 311 and the communication section 32.

In response to a frequency instruction F(n) being given by the controller 310, the signal creating section 311 creates a signal F of a predetermined frequency, and inputs the signal F to the transmission probe 21 through the amplifier 312 and the output terminal 34. The signal creating section 311 generates a pulse wave (a pulse signal) as the signal F, but may be configured to generate a continuous wave as the signal F.

The signal creating section 311 may include a function of sweeping a frequency of the signal F. In this case, the signal creating section 311 generates a signal F of a band of, for example, from 500 MHz to 8 GHz on the basis of an instruction given by the controller 310.

The phase shifter 313 splits the signal F into two signals that are 90 degrees out of phase, and inputs the two signals to the mixer 315. The mixer 315 mixes a reception signal with the two signals output from the phase shifter 313 to modulate those signals into two response signals (I/Q signals), the reception signal being input from the reception probe 22 through the input terminal 35 and the amplifier 314, the two response signals being in quadrature to each other. These response signals are converted into a digital signal from an analog signal through the AD converter 316, and the measurement signal S1 is generated by the controller 310 from the response signals.

The phase shifter 313 and the mixer 315 form a quadrature detector that performs a quadrature detection (an IQ detection) with respect to output from the reception probe 22. The sum of squares of an I signal and a Q signal corresponds to the intensity of a reception signal, the square root of the sum of squares of the I signal and the Q signal corresponds to an amplitude of the reception signal, and an arctangent of the I signal and the Q signal corresponds to a phase.

The communication section 32 includes a communication module that includes, for example, an antenna for communication. The communication section 32 is used to wirelessly transmit the measurement signal S1 from the sensor apparatus 10 to the signal processing unit 50. This makes it possible to provide the measurement signal S1 to the signal processing unit 50 arranged in a location different from an observation point. Without being limited thereto, the sensor apparatus 10 may be connected to the signal processing unit 50 through, for example, a distribution cable.

(Signal Processing Unit)

As illustrated in FIG. 2, the signal processing unit 50 includes a delay time calculator 51, a relative permittivity calculator 52, a water amount calculator 53, and a memory 54. The signal processing unit 50 is an information processing apparatus that measures a water amount in the medium M on the basis of the measurement signal S1 transmitted from the sensor apparatus 10 (the measurement unit 30).

The information processing apparatus may be implemented by hardware elements, such as a CPU, a random access memory (RAM), and a read only memory (ROM), that are used in a computer, and by necessary software. Instead of, or in addition to the CPU, for example, programmable logic device (PLD) such as a field programmable gate array (FPGA), a digital signal processor (DSP), or an application specific integrated circuit (ASIC) may be used.

In the present embodiment, the delay time calculator 51, the relative permittivity calculator 52, and the water amount calculator 53 are implemented as functional blocks by the CPU executing a predetermined program. The memory 54 is implemented by, for example, the ROM of the signal processing unit 50. Of course, dedicated hardware such as an integrated circuit (IC) may be used in order to implement each block. A program is installed on the signal processing unit 50, for example, through various recording media. Alternatively, a program may be installed through, for example, the Internet.

The delay time calculator 51 is configured to calculate, on the basis of the measurement signal S1, a delay time of a propagation of an electromagnetic wave EW between the transmission probe 21 (the tiny antenna section 210) and the reception probe 22 (the tiny antenna section 220).

The delay time of a propagation of an electromagnetic wave EW is the time of the propagation of the electromagnetic wave EW in the medium M. A delay time of a propagation of an electromagnetic wave depends on the relative permittivity of a transmission path, and a propagation delay time is proportional to the square root of the relative permittivity of a medium. In general, the relative permittivity of soil itself is from about 1 to about 10, and varies depending on a water amount. Thus, this indicates that the water amount in the medium M can be indirectly measured if it is possible to measure a propagation delay time.

A method for calculating a propagation delay time is not particularly limited, and in the present embodiment, an inverse Fourier transform (IFFT) is performed with respect to the measurement signal S1 to obtain an impulse response, and a pulse delay time is calculated from a peak position of the impulse response. The delay time of a propagation of the electromagnetic wave EW is calculated by subtracting transmission times (cable transmission times) of the probes 21 and 22 from the pulse delay time.

The relative permittivity calculator 52 is configured to calculate the relative permittivity of the medium M on the basis of the delay time of a propagation of the electromagnetic wave EW that is calculated by the delay time calculator 51. Typically, the relative permittivity of water is 80.

The water amount calculator 53 is configured to calculate a water amount in the medium M on the basis of the relative permittivity calculated by the relative permittivity calculator 52. For example, the Topp's formula is used to calculate the water amount (which will be described later), and a proportion of water content by volume [%] in the medium M is calculated as the water amount.

The signal processing unit 50 may further include, for example, a communication section and a display section, the communication section being capable of communicating with the communication section 32 of the measurement unit 30, the display section being capable of displaying thereon, for example, information regarding a propagation delay time, relative permittivity, and a water amount that are calculated in each functional block.

[Water Amount Measurement Method]

The signal processing unit 50 is described in detail below, together with a typical operation of the water amount measurement apparatus 100.

Figure 4:
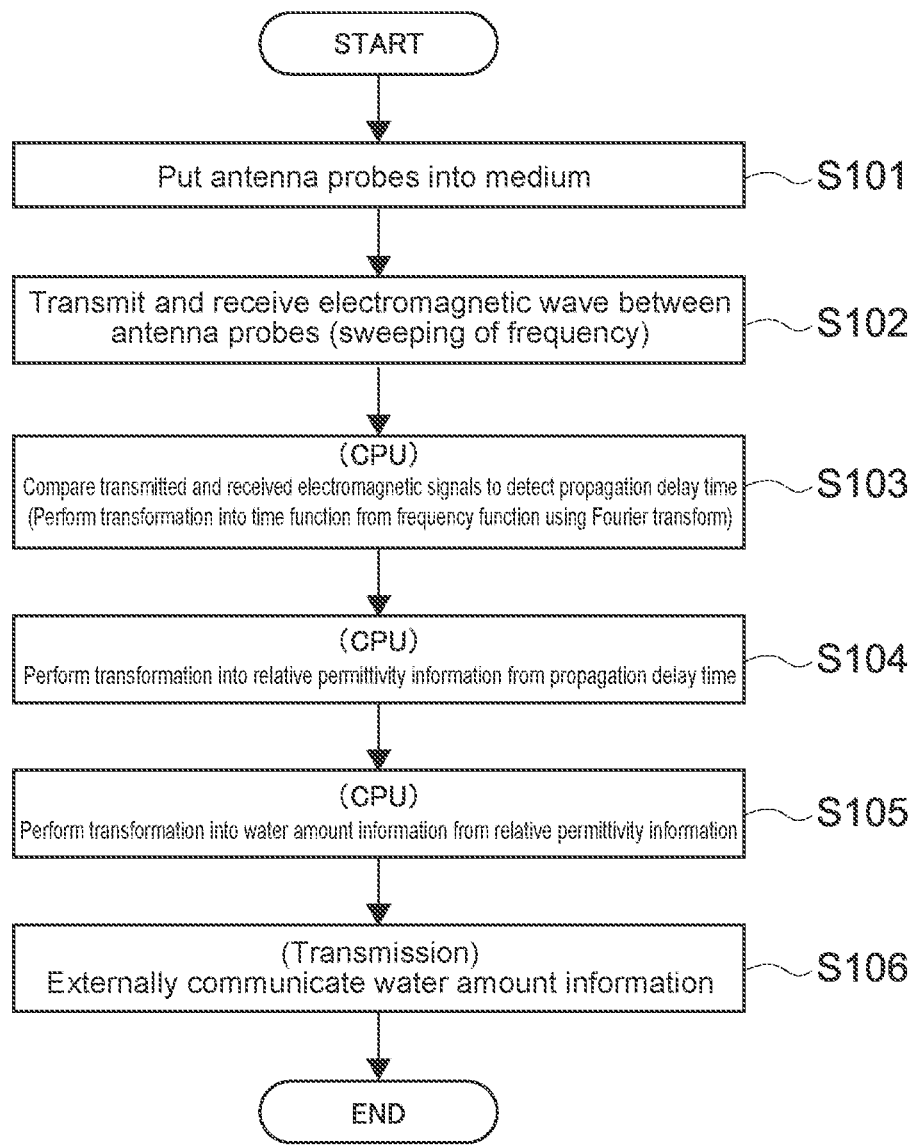
FIG. 4 is a flowchart of a water amount measurement method according to an embodiment of the present technology.

FIG. 4 is a flowchart of a water amount measurement method.

First, as illustrated in FIG. 1, the transmission probe 21 and the reception probe 22 are embedded in soil M (Step S101). The facing distance D between the transmission probe 21 and the reception probe 22 is, for example, 50 mm.

Next, an electromagnetic wave EW is transmitted and received between the transmission probe 21 (the tiny antenna section 210) and the reception antenna (the tiny antenna section 220) (Step S102, sweeping of a frequency).

The measurement unit 30 generates a measurement signal S1 while changing, in 10 MHz steps, a frequency of a transmission signal F(n) input to the transmission probe 21, the measurement signal S1 including orthogonal frequency response signals (an I(n) signal and a Q(n) signal) of a reception signal output from the reception probe 22, and transmits the measurement signal S1 to the signal processing unit 50.

Next, the signal processing unit 50 (the delay time calculator 51) compares the transmitted and received electromagnetic signals to calculate a delay time of a propagation of the electromagnetic wave EW between the transmission probe 21 and the reception probe 22 (Step S103).

The delay time calculator 51 performs an inverse fast Fourier transform (IFFT) to obtain an impulse response $h(\tau)$ from the reception signal, where the I(n) signal is a real part and the Q(n) signal is an imaginary part.

$$h(\tau) = \mathrm{IFFT}\{I(n), Q(n)\} \quad (1)$$

The delay time calculator 51 obtains a pulse delay time $\tau$ [s] from the peak position of the impulse response $h(\tau)$, and subtracts a cable transmission time $\tau_0$ [s] from the pulse delay time $\tau$ to obtain a propagation delay time $\tau_{delay}$ [s].

$$\tau_{delay} = \tau - \tau_0 \quad (2)$$

Next, the signal processing unit 50 (the relative permittivity calculator 52) calculates relative permittivity $\varepsilon_r$ of the medium M, where the propagation delay time is $\tau_{delay}$ [s], the light speed is c [m/s], and the distance (D) between probes is d [m] (Step S104).

$$\tau_{delay} = d \cdot \sqrt{\varepsilon_r}/c \quad (3)$$

Next, the signal processing unit 50 (the water amount calculator 53) calculates a water amount (a proportion of water content by volume) $\theta$ [%] in the medium M using the Topp's formula (Step S105).

$$\theta = -5.3 \times 10^{-2} + 2.92 \times 10^{-2} \varepsilon_r - 5.5 \times 10^{-4} \varepsilon_r^2 + 4.3 \times 10^{-6} \varepsilon_r^3 \quad (4)$$

As described above, the relative permittivity of the medium M and the proportion of water content by volume in the medium M are calculated. The calculated proportion of water content by volume in the medium M is transmitted to the outside as necessary (Step S106).

The signal processing unit 50 calculates the relative permittivity of the medium M and the proportion of water content by volume in the medium M on the basis of a delay time of a propagation of the electromagnetic wave EW between the transmission probe 21 and the reception probe 22 in the medium M. The distance D (50 mm) between the two probes 21 and 22 is much larger than a gap (1 mm) produced in the vicinity of each of the probes 21 and 22, and thus the impact those gaps have on the measurement of the relative permittivity is smaller. This results in preventing an error in measurement from occurring due to a gap, and results in improving the accuracy in the measurement of relative permittivity of the medium M and a proportion of water content by volume in the medium M.

Comparative Example 1

Figure 5:
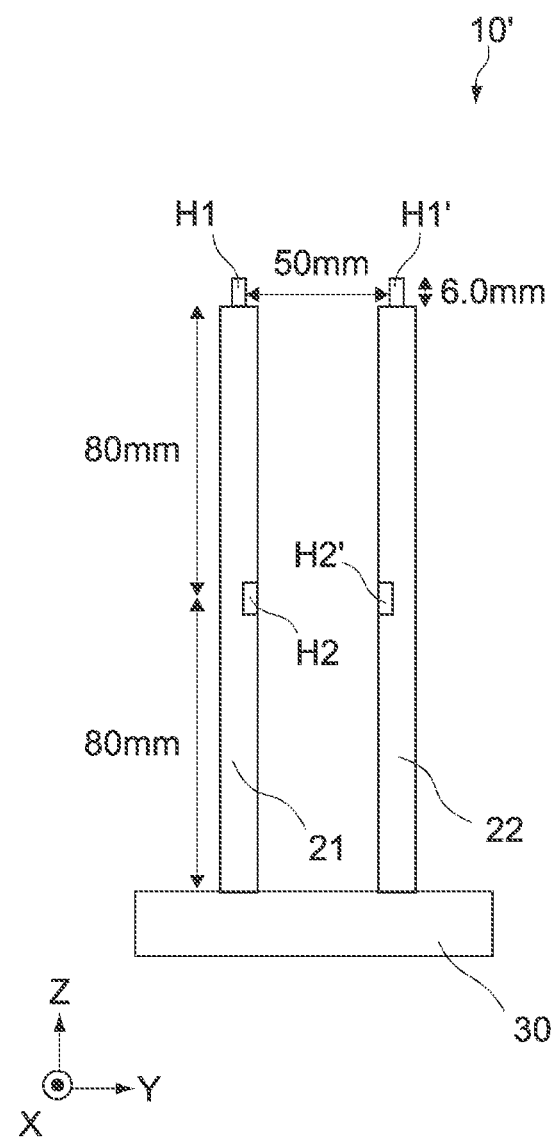
FIG. 5 schematically illustrates a configuration of a sensor head according to Comparative Example 1.

The sensor head 20 including one tiny antenna section 210 for transmission being provided to the transmission probe 21 and one tiny antenna section 220 for reception being provided to the reception probe 22 has been described above. Here, for example, a proportion of content by volume in a medium can be measured at different depths by providing a plurality of tiny antenna sections for transmission and a plurality of tiny antenna sections for reception to the transmission probe 21 and the reception probe 22, respectively. FIG. 5 illustrates an example of a configuration of a sensor apparatus 10' that includes two tiny antenna sections for transmission and two tiny antenna sections for reception.

The sensor apparatus 10' illustrated in FIG. 5 is similar to the sensor apparatus 10 of the basic configuration in including the transmission probe 21, the reception probe 22, and the measurement unit 30, and is different from the sensor apparatus 10 in that the transmission probe 21 and the reception probe 22 each include a plurality of tiny antenna sections. Note that an X axis, a Y axis, and a Z axis in FIG. 5 respectively represent directions of three axes that are orthogonal to each other.

In the sensor apparatus 10', the transmission probe 21 and the reception probe 22 are respectively linearly formed to be parallel to the Z-axis direction, and respectively include a plurality of openings H1 and H2 and a plurality of openings H1' and H2'.

The opening H1 is a first tiny antenna section for transmission that is provided to the tip of the transmission probe 21. The opening H2 is a second tiny antenna section for transmission that is provided to a portion situated midway between the tip of the transmission probe 21 and a base end of the transmission probe 21 on the side of the measurement unit 30.

The opening H1' is a first tiny antenna section for reception that is provided to the tip of the reception probe 22. The opening H2' is a second tiny antenna section for reception that is provided to a portion situated midway between the tip of the reception probe 22 and a base end of the reception probe 22 on the side of the measurement unit 30.

The transmission probe 21 and the reception probe 22 are equal in length. The opening H1 and the opening H1' face each other in the Y-axis direction, and the opening H2 and the opening H2' face each other in the Y-axis direction.

For example, a distance (D) between the probes 21 and 22 is 50 mm, a distance from the base end of the probe 21, 22 to the opening H2, H2' is 80 mm, and a distance from the opening H2, H2' to the opening H1, H1' is also 80 mm. Those are examples of the sizes of the respective portions. Note that coaxial cables for the respective openings H1, H2, H1', and H2' each have an axial length of 6.0 mm.

The sensor apparatus 10' having such a configuration includes two pairs of antenna sections for transmission and reception (a pair of openings H1 and H1' and a pair of opening H2 and H2'), where the antenna sections for transmission and reception in each pair face each other. Thus, a water amount in a medium at a distance (depth) of 80 mm from the measurement unit 30 and a water amount in the medium at a distance (depth) of 160 mm from the measurement unit 30 can be measured at the same time.

However, it has turned out that, when a measurement distance between a certain tiny opening provided to the transmission-side probe and a certain tiny opening provided to the reception-side probe, and a measurement distance between another tiny opening provided to the transmission-side probe and another tiny opening provided to the reception-side probe (total lengths of signal transmission paths) are equal, paths unintentionally have equal propagation lengths. The inventors have found out that this results in causing noise, and thus in causing an error in measurement.

Figure 6:
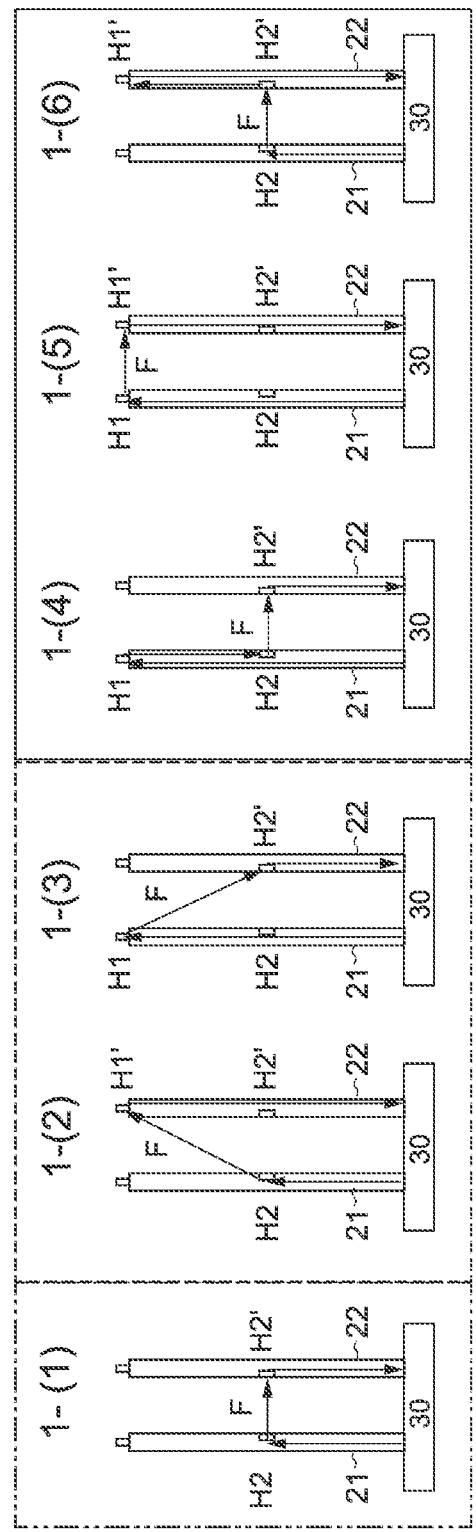
FIG. 6 illustrates a pattern of transmitting a signal in the sensor head of FIG. 5.

FIG. 6 schematically illustrates a pattern of a path for transmitting a signal F in the sensor apparatus 10' illustrated in FIG. 5. A probe length (a path length in each probe), an air length (a path length between two probes), and a total length of the probe length and the air length in the pattern of each transmission path of FIG. 6 are given in Table 1.

TABLE 1

[unit: mm]

|  | 1-(1) | 1-(2) | 1-(3) | 1-(4) | 1-(5) | 1-(6) |
|---|---|---|---|---|---|---|
| Probe length | (160) | (240) | (240) | (320) | (320) | (320) |
|  | 232 | 348 | 348 | 464 | 464 | 464 |
| Air length | 50 | 94.3 | 94.3 | 50 | 50 | 50 |
| Total length | (210) | (334.3) | (334.3) | (370) | (370) | (370) |
|  | 282 | 442 | 442 | 514 | 514 | 514 |

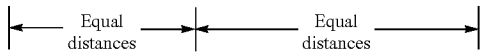

|←—— Equal distances ——→|←—— Equal distances ——→|

In Table 1, a value of measurement of the probe length in parentheses is multiplied by $\sqrt{(2.1)}=1.45$ in consideration of the relative permittivity (for example, 2.1) of an insulating material (such as PTFE) used to protect a coaxial cable, since the permittivity has an impact on the measurement when a signal passes through a transmission path.

Figure 11:
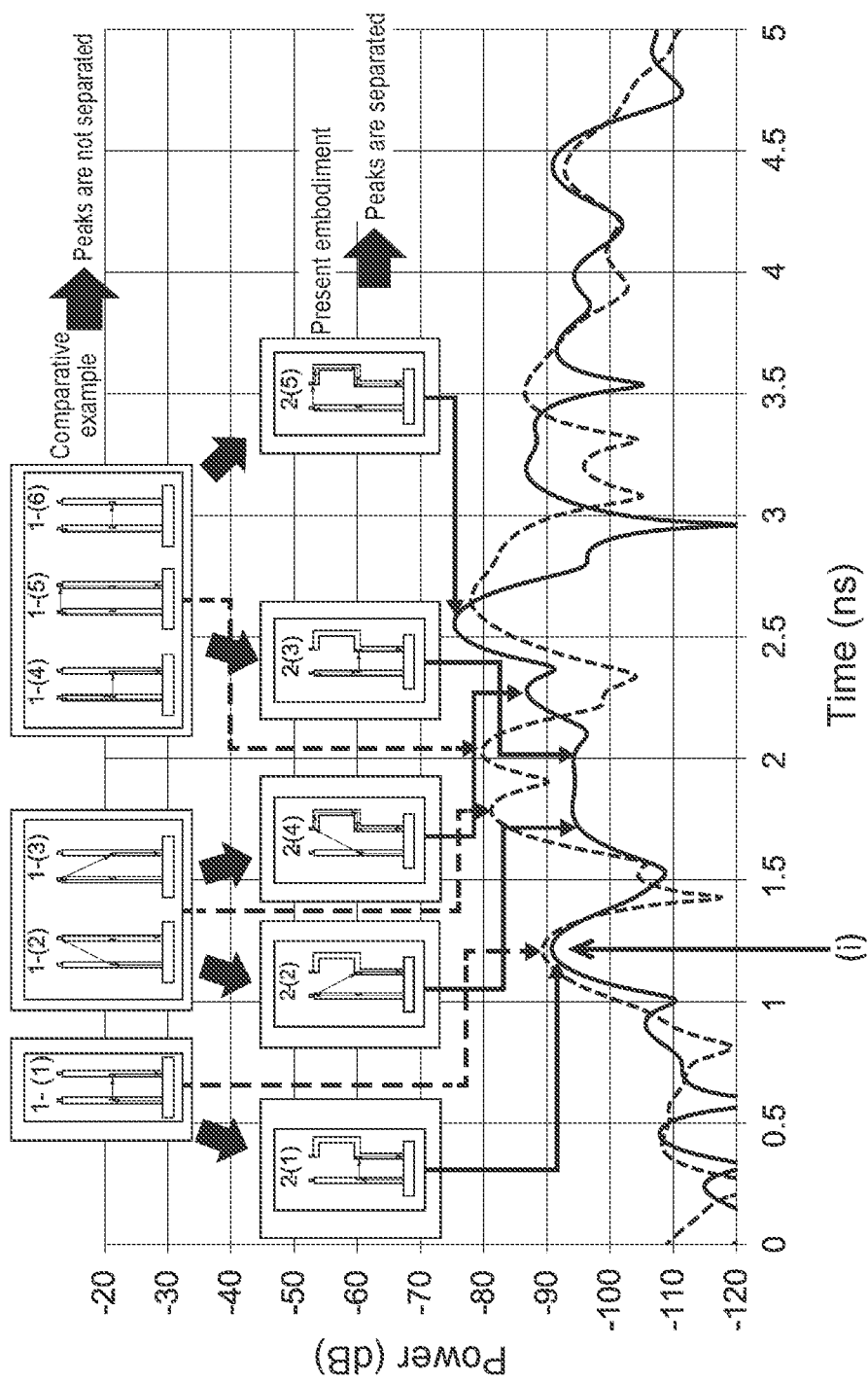
FIG. 11 is a graph in which the results of FIGS. 7 and 10 overlap.

In FIG. 11, the signal F is transmitted in order of the base end of the transmission probe 21→the opening H2→the medium→the opening H2'→the base end of the reception probe 22 in the case of a transmission-path pattern 1-(1).

The signal F is transmitted in order of the base end of the transmission probe 21→the opening H2→the medium→the opening H1'→the opening H2'→the base end of the reception probe 22 in the case of a transmission-path pattern 1-(2).

The signal F is transmitted in order of the base end of the transmission probe 21→the opening H2→the opening H1→the medium→the opening H2'→the base end of the reception probe 22 in the case of a transmission-path pattern 1-(3).

The signal F is transmitted in order of the base end of the transmission probe 21→the opening H2→the opening H1→the opening H2 (reflection)→the medium→the opening H2'→the base end of the reception probe 22 in the case of a transmission-path pattern 1-(4).

The signal F is transmitted in order of the base end of the transmission probe 21→the opening H2→the opening H1→the medium→the opening H1'→the opening H2'→the base end of the reception probe 22 in the case of a transmission-path pattern 1-(5).

The signal F is transmitted in order of the base end of the transmission probe 21→the opening H2→the medium→the opening H2'→the opening H1'→the opening H2' (reflection)→the base end of the reception probe 22 in the case of a transmission-path pattern 1-(6).

The two probes 21 and 22 have shapes symmetrical to each other, and the respective corresponding openings of the two probes 21 and 22 are in a symmetric position. Consequently, the two transmission-path patterns 1-(2) and 1-(3) provide equal total lengths of a transmission path of the signal F, and the three transmission-path patterns 1-(4), 1-(5), and 1-(6) provide equal total lengths of a transmission path of the signal F. Thus, it is difficult to accurately determine a difference in measurement signal that is caused due to those six transmission-path patterns.

Figure 7:
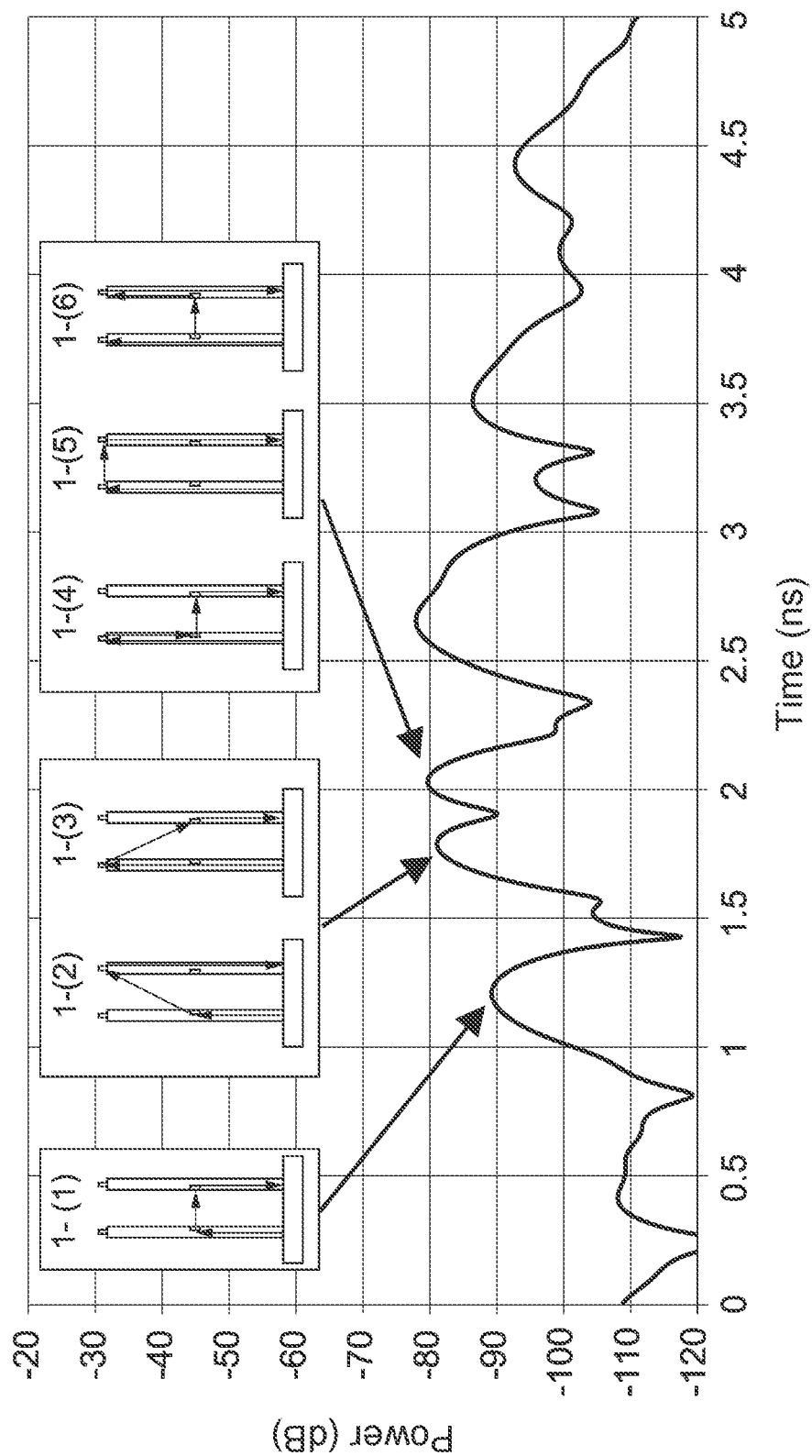
FIG. 7 is a graph illustrating a result of test measurement performed by transmitting and receiving an electromagnetic wave of a predetermined frequency using the sensor head of FIG. 5.

FIG. 7 is a graph illustrating an example of a result of test measurement performed by transmitting and receiving an electromagnetic wave EW of a predetermined frequency using the sensor apparatus 10' illustrated in FIG. 5. In the figure, a horizontal axis represents a time (unit: ns), and a vertical axis represents a power (unit: dB).

As illustrated in FIG. 7, a power peak (a response output) that corresponds to the transmission-path pattern 1-(1) is observed around a time 1.2 [ns]. Further, power peaks that respectively correspond to the transmission-path patterns 1-(2) and 1-(3) are observed around a time 1.7 [ns].

Furthermore, power peaks that respectively correspond to the transmission-path patterns 1-(4), 1-(5), and 1-(6) are observed around a time 2.1 [ns].

This shows that, as described above, power peaks (response outputs) of a plurality of signal-transmission-path patterns are not separated (overlap) on a temporal axis when the probe structure of the sensor apparatus 10' is adopted. Thus, when the probe structure of the sensor apparatus 10' is adopted, different signal-transmission-path patterns may provide equal measurement distances (total lengths), and this results in causing noise (an error in measurement). In other words, it is difficult to accurately measure a water amount at different locations in a medium.

Thus, it is an object of the present embodiment to suppress a reduction in measurement accuracy that is caused due to a difference between signal transmission paths of a plurality of signal transmission paths in a sensor apparatus that includes a transmission probe and a reception probe that each include a plurality of tiny antenna sections. Embodiments of the present technology are described below.

First Embodiment (When there are Two Openings)

Figure 8:
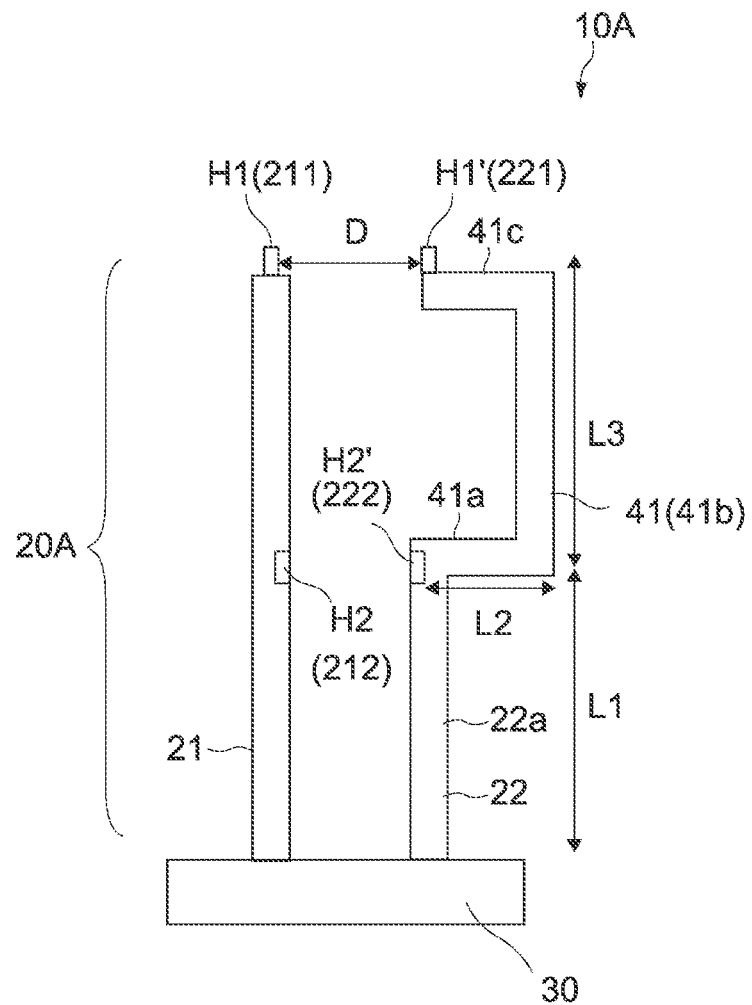
FIG. 8 schematically illustrates a configuration of a sensor apparatus according to a first embodiment of the present technology.

FIG. 8 schematically illustrates a configuration of a sensor apparatus 10A according to a first embodiment of the present technology.

The sensor apparatus 10A of the present embodiment includes a sensor head 20A and the measurement unit 30. The sensor apparatus 10A and the signal processing unit 50 described above are included in a water amount measurement apparatus (the same applies to the following description).

The sensor head 20A includes the transmission probe 21 (the first probe) and the reception probe 22 (the second probe).

The transmission probe 21 includes a first tiny antenna section 211 for transmission (the opening H1) and a second tiny antenna section 212 for transmission (the opening H2).

The reception probe 22 is arranged at a predetermined distance from the transmission probe 21, and includes a first tiny antenna section 221 for reception (the opening H1') and a second tiny antenna section 222 for reception (the opening H2').

The measurement unit 30 includes the controller 310 (refer to FIG. 3) generating the measurement signal S1 including information regarding the characteristics of a propagation of an electromagnetic wave in a medium between the first tiny antenna section 211 for transmission and the first tiny antenna section 221 for reception, and information regarding the characteristics of the propagation of the electromagnetic wave in the medium between the second tiny antenna section 212 for transmission and the second tiny antenna section 222 for reception.

The measurement unit 30 has a configuration similar to the configuration of the measurement unit 30 of the sensor apparatus 10 of the basic configuration. Thus, a detailed description thereof is omitted here. The sensor head 20A is described in detail below. In the following description, respective ends of the transmission probe 21 and the reception probe 22 that are situated on the side of the measurement unit 30 are each also referred to as a base end, and respective opposite ends of the transmission probe 21 and the reception probe 22 are each also referred to as a tip.

The transmission probe 21 is linearly formed from the base end to the tip to be parallel to the Z-axis direction. The first tiny antenna section 211 for transmission corresponds to the opening H1 formed in the tip of the transmission probe 21. The second tiny antenna section 212 for transmission corresponds to the opening H2 formed in a portion situated midway between the base end and the tip of the transmission probe 21.

The reception probe 22 includes a straight portion 22a that is connected to the measurement unit 30 and parallel to the Z-axis direction, and a bent portion 41 that is bent to extend toward the tip of the reception probe 22 from the straight portion 22a.

The straight portion 22a is arranged at a distance D from the transmission probe 21 in the Y-axis direction.

The bent portion 41 includes a first portion 41a that extends in parallel with the Y-axis direction from the straight portion 22a in a direction that is opposite to the transmission probe 21, a second portion 41b that extends in parallel with the Z-axis direction from the first portion 41a, and a third portion 41c that extends in parallel with the Y-axis direction from the second portion 41b in a direction of the transmission probe 21. A tip of the third portion 41c is the tip of the reception probe 22, and is situated at the distance D from the tip of the transmission probe 21 to face the tip of the transmission probe 21 in the Y-axis direction.

The first tiny antenna section 221 for reception corresponds to the opening H1' formed in the tip of the reception probe 22. The second tiny antenna section 222 for reception corresponds to the opening H2' provided to an end of the first portion 41a on the side of the straight portion 22a. The bent portion 41 is provided between the opening H1' and the opening H2'.

The opening H1 and the opening H1' are situated at the distance D from each other to face each other in the Y-axis direction. Likewise, the opening H2 and the opening H2' are situated at the distance D from each other to face each other in the Y-axis direction.

Note that the bent portion 41 of the reception probe 22 is not limited to having a crank-like shape (a U-shape), as described above, and the bent portion 41 may have a curved shape. Further, the transmission probe 21 may be formed into a bent shape, and the reception probe 22 may be formed into a straight shape. In other words, it is sufficient if the two probes have shapes asymmetrical to each other in a Y-Z plane or a Z-X plane.

In the sensor apparatus 10A of the present embodiment, the transmission probe 21 and the reception probe 22 have different probe lengths, as described above. The probe length of the transmission probe 21 refers to a length (an axial length) in the Z-axis direction, and the probe length of the reception probe 22 refers to a length corresponding to the sum total of an axial length L1 of the straight portion 22a and the sum of axial lengths of the first to third portions 41a to 41c (L2+L3+L2) included in the bent portion 41. In other words, the probe length of the reception probe 22 is larger than the probe length of the transmission probe 21 by a length corresponding to 2×L2.

For example, the distance (D) between the probes 21 and 22 is 50 mm, L1 is 80 mm, L2 is 40 mm, and L3 is 80 mm. Those are examples of the sizes of the respective portions. Coaxial cables for the respective openings H1, H2, H1', and H2' each have an axial length of 6.0 mm.

In the sensor apparatus 10A having the configuration described above, the measurement unit 30 transmits the signal F from the opening H1, H2 of the transmission probe 21, and measures the characteristics of a propagation of the signal F received at the opening H1, H2' of the reception probe 22 through a medium.

Figure 9:
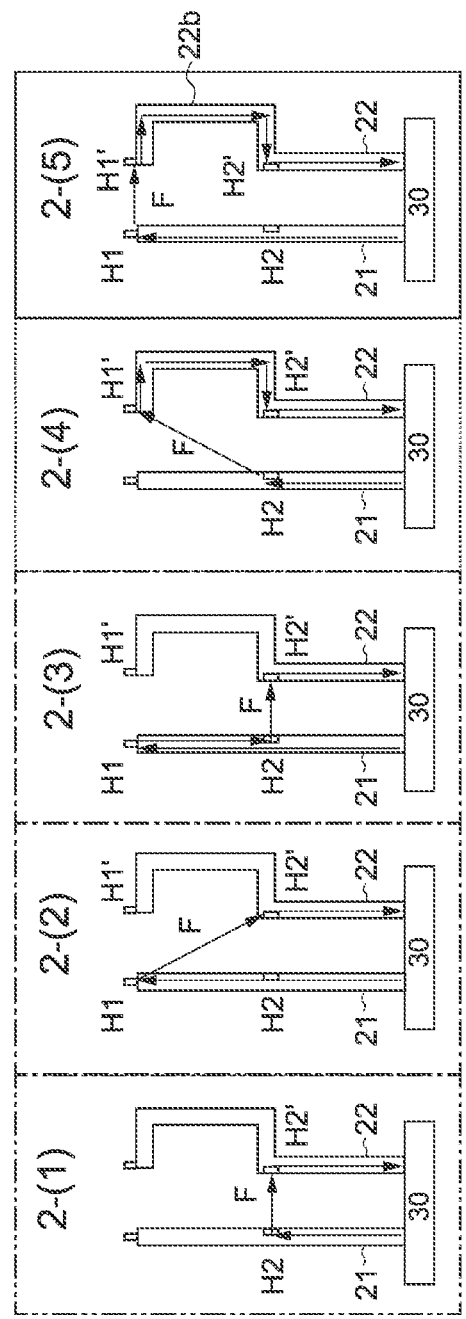
FIG. 9 illustrates a pattern of transmitting a signal in the sensor apparatus of FIG. 8.

FIG. 9 schematically illustrates a pattern of a path for transmitting the signal F in the sensor apparatus 10A illustrated in FIG. 8. A probe length (a path length in each probe), an air length (a path length between two probes), and a total length of the probe length and the air length in the pattern of each transmission path of FIG. 9 are given in Table 2.

TABLE 2

| | [unit: mm] | | | | |
|---|---|---|---|---|---|
| | 2-(1) | 2-(2) | 2-(3) | 2-(4) | 2-(5) |
| Probe length | (160) | (240) | (320) | (400) | (320) |
| | 232 | 348 | 464 | 580 | 464 |
| Air length | 50 | 94.3 | 50 | 50 | 94.3 |
| Total length | (210) | (334.3) | (370) | (450) | (426.3) |
| | 282 | 452.8 | 514 | 630 + α | 558.3 + α |

In Table 2, a value of measurement of the probe length in parentheses is multiplied by $\sqrt{(2.1)}=1.45$ in consideration of the relative permittivity (for example, 2.1) of an insulating material (such as PTFE) used to protect a coaxial cable, since the permittivity has an impact on the measurement when a signal passes through a transmission path. Further, a portion α in the total length corresponds to a length of a bending portion for bending a coaxial cable at a substantially right angle to form the coaxial cable into a U-shape.

In FIG. 9, the signal F is transmitted in order of the base end of the transmission probe 21→the opening H2→the medium→the opening H2'→the base end of the reception probe 22 in the case of a transmission-path pattern 2-(1).

The signal F is transmitted in order of the base end of the transmission probe 21→the opening H2→the opening H1→the medium→the opening H2'→the base end of the reception probe 22 in the case of a transmission-path pattern 2-(2).

The signal F is transmitted in order of the base end of the transmission probe 21→the opening H2→the opening H1→the opening H2 (reflection)→the medium→the opening H2'→the base end of the reception probe 22 in the case of a transmission-path pattern 2-(3).

The signal F is transmitted in order of the base end of the transmission probe 21→the opening H2→the medium→the opening H1'→the bent portion 41→the opening H2'→the base end of the reception probe 22 in the case of a transmission-path pattern 2-(4).

The signal F is transmitted in order of the base end of the transmission probe 21→the opening H2→the opening H1→the medium→the opening H1'→the bent portion 41→the opening H2'→the base end of the reception probe 22 in the case of a transmission-path pattern 2-(5).

Since the bent portion 41 is provided to the reception probe 22, the transmission probe 21 and the reception probe 22 have shapes asymmetrical to each other, and all of the transmission-path patterns described above provide different total lengths.

Figure 10:
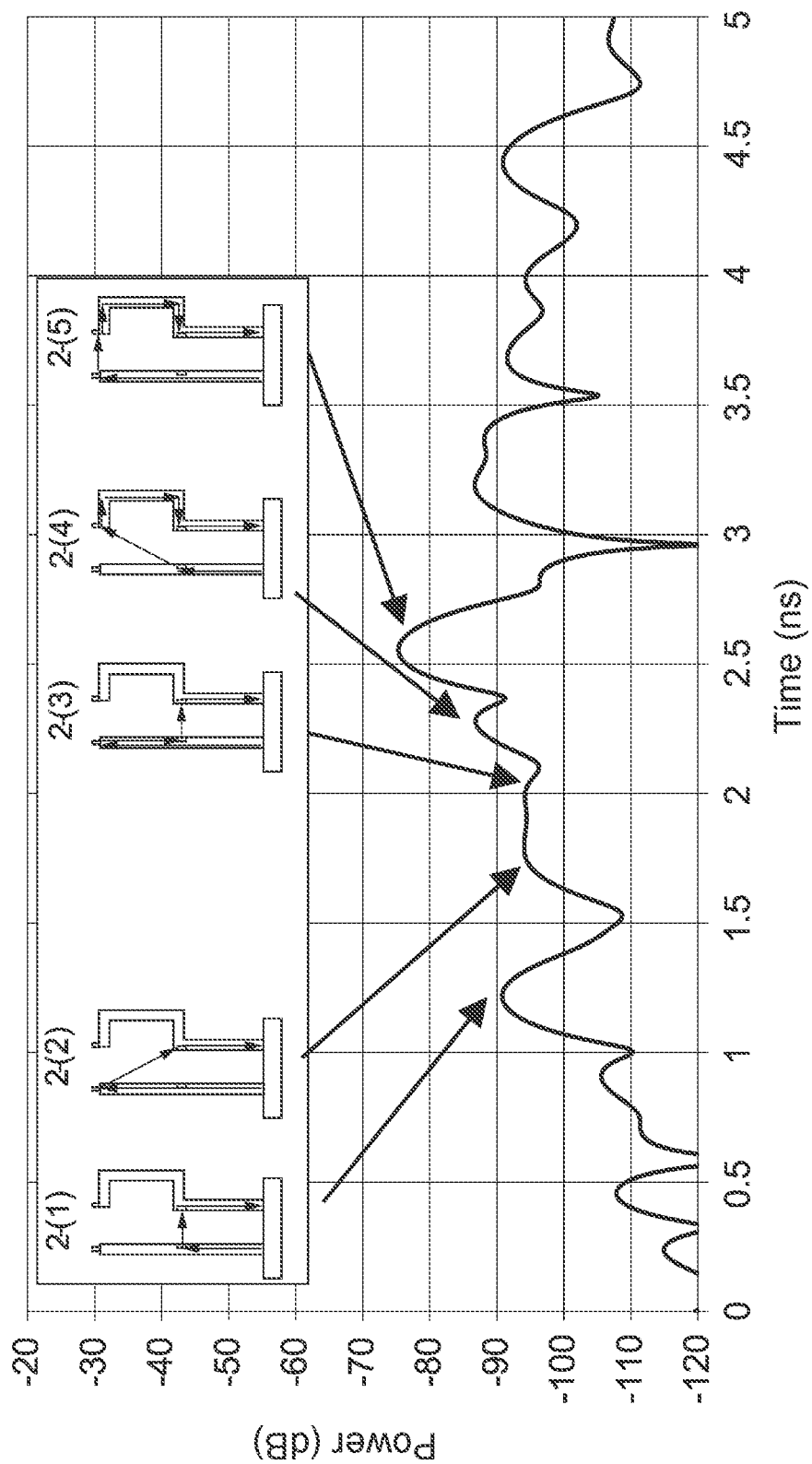
FIG. 10 is a graph illustrating a result of test measurement performed by transmitting and receiving an electromagnetic wave of a predetermined frequency using the sensor apparatus of FIG. 8.

FIG. 10 is a graph illustrating an example of a result of test measurement performed by transmitting and receiving an electromagnetic wave EW of a predetermined frequency using the sensor apparatus 10A of FIG. 8. In the figure, a horizontal axis represents a time (unit: ns), and a vertical axis represents a power (unit: dB).

As illustrated in FIG. 10, a power peak (a response output) that corresponds to the transmission-path pattern 2-(1) is observed around a time 1.2 [ns].

Further, a power peak that corresponds to the transmission-path pattern 2-(2) is observed around a time 1.7 [ns]. This power peak is about 26% smaller than the power peak of the signal-transmission-path pattern 2-(5), which is a primary path. Thus, there is no need for the separation on the temporal axis.

Furthermore, a power peak that corresponds to the transmission-path pattern 2-(3) is observed around a time 2.1 [ns], and a power peak that corresponds to the transmission-path pattern 2-(4) is observed around a time 2.3 [ns]. Further, a power peak that corresponds to the transmission-path pattern 2-(5) is observed around a time 2.6 [ns].

This shows that, as described above, power peaks (response outputs) of the respective signal-transmission-path patterns are separated (do not overlap) on the temporal axis when the probe structure of the sensor apparatus 10A is adopted. Thus, when the sensor apparatus 10A of the present embodiment is adopted, different signal-transmission-path patterns do not provide equal measurement distances (total lengths), and this makes it possible to reduce an error in measurement. This results in improving the accuracy in the measurement of relative permittivity of a medium or a water amount in the medium.

FIG. 11 is a graph in which the measurement results illustrated in FIGS. 7 and 10 overlap.

In Comparative Example 1 (FIG. 7, a symmetric type), the signals F overlap and thus power peaks are not separated. On the other hand, power peaks are separated in the present embodiment (FIG. 10, an asymmetric type). The propagation time is longer in the present embodiment than in Comparative Example except for one point (2-(2)), and thus it is clear that the propagation distance and the time are linked to each other. A point ((i) in the figure) at which Comparative Example and the present embodiment exhibit power peaks at the same time corresponds to criteria for a power peak separation.

(Regarding Resolution)

When $\Delta f$ is a frequency band of a measurement signal S1, a time resolution $\Delta t$ of the measurement signal S1 on which an inverse Fourier transform has been performed is represented as indicated below.

$$\Delta t = 1/\Delta f$$

When c is a speed of light ($3.0 \times 10^8$ [m/s]), the following relationship is satisfied in a vacuum when conversion into a distance is performed.

$$\Delta \lambda = c/\Delta f$$

An effective wavelength $\Delta \lambda g$ of the frequency band $\Delta f$ in a medium of which a refractive index is n, is represented as indicated below.

$$\Delta \lambda g = c/n\Delta f$$

The refractive index n is obtained by multiplying relative permittivity $\varepsilon r$ by relative permeability $\mu r$ and taking a square root of a value obtained by the multiplication, and is represented by $n = \sqrt{(\varepsilon r \mu r)}$.

In order to separate adjacent peaks of patterns of a signal transmission path between the transmission probe 21 and the reception probe 22, it is necessary that a distance $\Delta d$ between the probes 21 and 22 be greater than or equal to $\Delta \lambda g$. In other words, the following relationship is satisfied.

$$\Delta d > \Delta \lambda g \times X$$

Here, X is a coefficient determined by a material of the probes 21 and 22, and may be 1.

When a material of an insulating material of a coaxial cable is polytetrafluoroethylene (PTFE, of which the relative permittivity $\varepsilon r$ is 2.1), the effective wavelength $\Delta \lambda g$ when $\Delta f$ is 9 GHz is represented as indicated below.

$$\Delta \lambda g = 1/\sqrt{(\text{the permittivity of } PTFE)} \times$$
$$(\text{a wavelength of a measurement band})$$
$$= 1/\sqrt{(2.1)} \times 33.3103$$
$$= 22.97 \text{mm} = 2.297 \text{cm}$$

Thus, when a measurement band is 9 GHz and when a material of an insulating material of a coaxial cable is PTFE, it is necessary that the distance $\Delta d$ between the probes 21 and 22 be greater than or equal to 2.3 cm. Likewise, when a measurement band is between 1 GHz and 9 GHz and when a material of an insulating material of a coaxial cable is PTFE, it is necessary that the distance $\Delta d$ between the probes 21 and 22 be greater than or equal to 2.6 cm.

Likewise, when a measurement band is greater than or equal to 10 GHz (that is, when a frequency is swept at 0 GHz to 10 GHz) and when a material of an insulating material of a coaxial cable is PTFE, it is necessary that the distance $\Delta d$ between the probes 21 and 22 be greater than or equal to 2.06 cm (refer to Table 3).

TABLE 3

| | | Wavelength resolution | |
|---|---|---|---|
| Band | Wavelength | In air | In PTFE |
| 86 Hz(1-9 GHz) (Present embodiment) | 37.47 mm | 3.75 cm | 2.59 cm |
| 9 GHz(1-10 GHz) | 33.31 mm | 3.33 mm | 2.30 mm |
| 10 GHz(0-10 GHz) | 29.98 mm | 3.00 cm | 2.06 cm |

Figure 12:
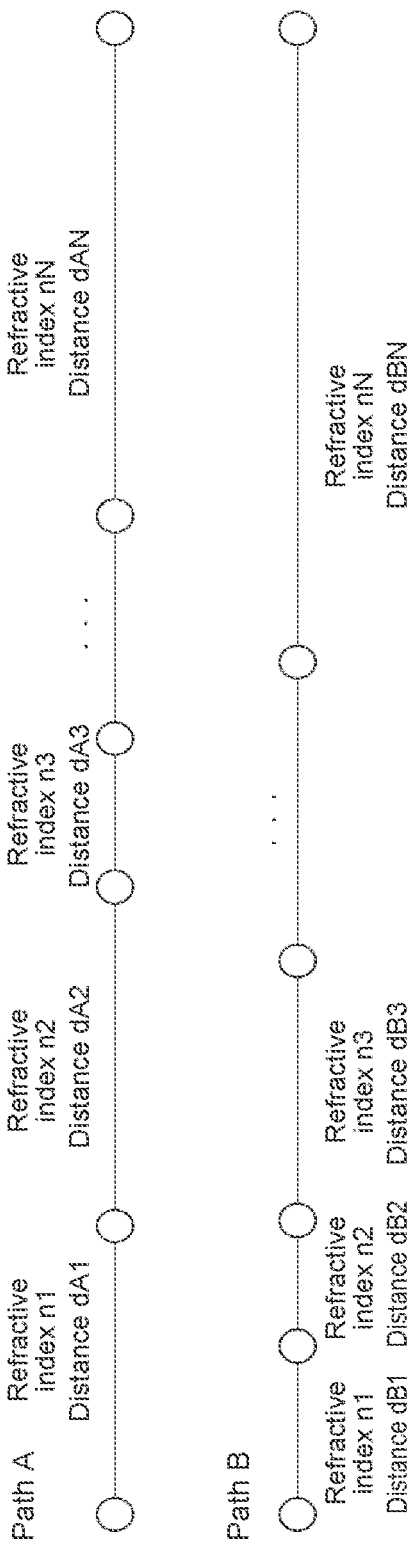
FIG. 12 schematically illustrates configurations of two arbitrary adjacent paths of patterns of a signal transmission path between probes of the present technology.

Here, it is assumed that two arbitrary adjacent paths of the patterns of a signal-transmission path between the probes 21 and 22 are paths A and B illustrated in FIG. 12. It is assumed that, with respect to a medium M, a coaxial cable, and the like, different types are not used for the path A (one of the paths) and the path B (another of the paths). When $n_N$ and $d_{AN}$ are a refractive index and a distance between openings (tiny antenna sections) in the path A, respectively, and when $n_N$ and $d_{BN}$ are a refractive index and a distance between openings (tiny antenna sections) in the path B, respectively, the propagation time $T_A$ of propagation through the path A is represented using a formula indicated below.

$$T_A = \sum_{i=1}^{N} \frac{n_i d_{Ai}}{c_0} \quad \text{[Math. 1]}$$

Here, $c_0$ is a speed of light (3.0×108 [m/s]).

The propagation time $T_B$ of propagation through the path B is represented using a formula indicated below.

$$T_B = \sum_{i=1}^{N} \frac{n_i d_{Bi}}{c_0} \quad \text{[Math. 2]}$$

When a difference between $T_A$ and $T_B$ is greater than or equal to $1/\Delta f$, the adjacent peaks described above are separated. When conversion into a distance is performed, the following relationship is satisfied.

$$\left| \sum_{i=1}^{N} n_i (d_{Ai} - d_{Bi}) \right| > \Delta\lambda = \frac{c_0}{\Delta f} \quad \text{[Math. 3]}$$

The sensor head 20A of the sensor apparatus 10A illustrated in FIG. 8 includes a first signal-transmission path and a second signal-transmission path.

The first signal-transmission path is a path that passes between the opening H1 (the first tiny antenna section 211 for transmission) and the opening H1' (the first tiny antenna section 221 for reception), or between the opening H1 (the first tiny antenna section 211 for transmission) and the opening H2' (the second tiny antenna section 222 for reception). In the example of FIG. 9, the first signal-transmission path corresponds to the transmission-path patterns 2-(2) and 2-(5).

The second signal-transmission path is a path that passes between the opening H2 (the second tiny antenna section 212 for transmission) and the opening H1' (the first tiny antenna section 221 for reception), or between the opening H2 (the second tiny antenna section 212 for transmission) and the opening H2' (the second tiny antenna section 222 for reception). In the example of FIG. 9, the second signal-transmission path corresponds to the transmission-path patterns 2-(1), 2-(3), and 2-(4).

Further, in the sensor head 20A, a difference in path length between the first signal-transmission paths, a difference in path length between the second signal-transmission paths, and a difference in path length between the first signal-transmission path and the second signal-transmission path are each set to be greater than or equal to a predetermined effective wavelength (for example, greater than or equal to 2.06 cm), in order to satisfy the formula [Math. 3].

Figure 13:
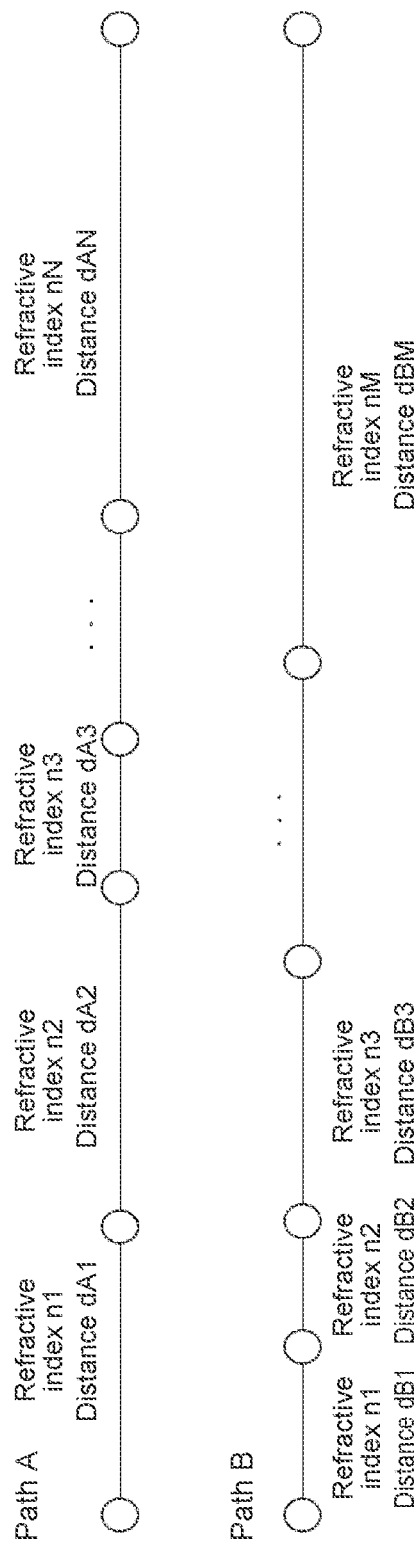
FIG. 13 schematically illustrates configurations of two arbitrary other adjacent paths of patterns of a signal transmission path between the probes of the present technology.

Alternatively, it is assumed that two arbitrary adjacent paths of patterns of a signal-transmission path between the probes 21 and 22 that are described later, are paths A and B illustrated in FIG. 13. Here, it is assumed that, with respect to a medium M, a coaxial cable, and the like, different types may be used for the path A and the path B. In other words, when $n_N$ and $d_{AN}$ are a refractive index and a distance between openings (described later) in the path A, respectively, and when $n_M$ and $d_{BM}$ are a refractive index and a distance between openings (described later) in the path B, respectively ($N \neq M$, $n_N \neq n_M$), the propagation time $T_A$ of propagation through the path A is represented using a formula indicated below.

$$T_A = \sum_{i=1}^{N} \frac{n_{Ai} d_{Ai}}{c_0} \quad \text{[Math. 4]}$$

The propagation time $T_B$ of propagation through the path B is represented using a formula indicated below.

$$T_B = \sum_{i=1}^{M} \frac{n_{Bi} d_{Bi}}{c_0} \quad \text{[Math. 5]}$$

When a difference between $T_A$ and $T_B$ is greater than or equal to $1/\Delta f$, the adjacent peaks described above are separated. When conversion into a distance is performed, the following relationship is satisfied.

$$\left| \sum_{i=1}^{N} n_{Ai} d_{Ai} - \sum_{i=1}^{M} n_{Bi} d_{Bi} \right| > \Delta\lambda = \frac{c_0}{\Delta f} \quad \text{[Math. 6]}$$

Also in this case, in the sensor head 20A, a difference in path length between the first signal-transmission paths, a difference in path length between the second signal-transmission paths, and a difference in path length between the first signal-transmission path and the second signal-transmission path are each set in order to satisfy the formula [Math. 6].

Second Embodiment

Figure 14:
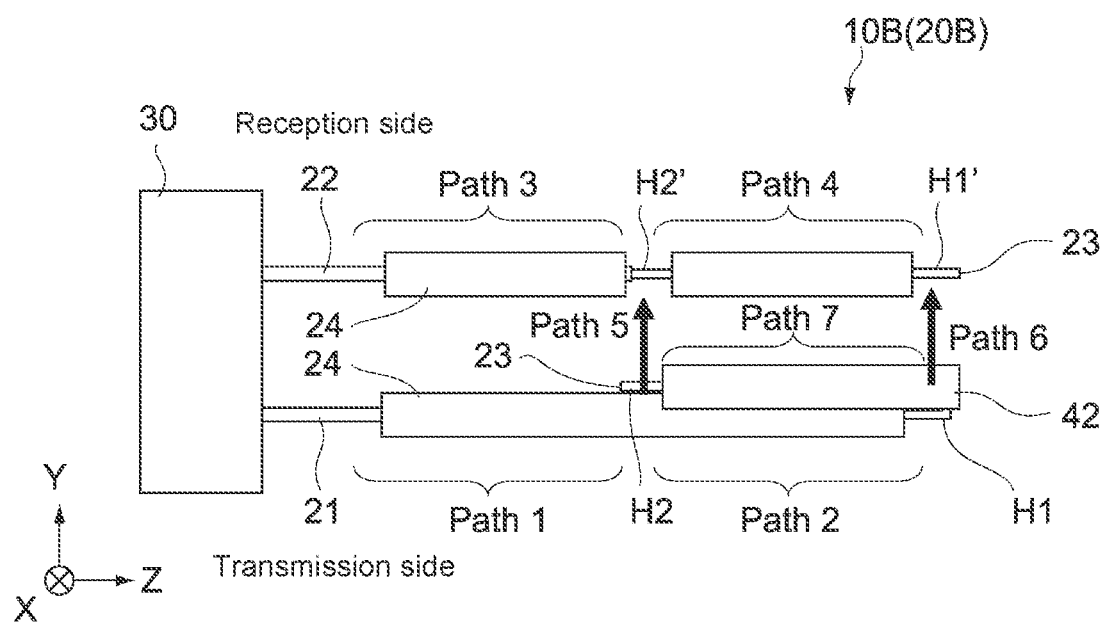
FIG. 14 schematically illustrates a configuration of a sensor apparatus according to a second embodiment of the present technology.

FIG. 14 schematically illustrates a configuration of a sensor apparatus 10B according to a second embodiment of the present technology.

The sensor apparatus 10B according to the present embodiment includes a sensor head 20B and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

In the sensor head 20B of the present embodiment, the transmission probe 21 is arranged parallel to the Z-axis direction, and includes a fold portion 42 that causes the tip 23 of the transmission probe 21 to be oppositely oriented in a direction of the measurement unit 30. The opening H1 serving as a first tiny antenna section for transmission is provided to the fold portion 42, and the opening H2 serving as a second tiny antenna section for transmission is provided to the tip 23 of the transmission probe 21.

In the sensor head 20B of the present embodiment, the reception probe 22 is arranged parallel to the Z-axis direction, and has a probe length that is equal to a length from the base end of the transmission probe 21 to the fold portion 42. The opening H1' serving as a first tiny antenna section for reception is provided to the tip 23 of the reception probe 22, and the opening H2' serving as a second tiny antenna section for reception is provided to a portion situated midway between the base end and the tip 23 of the reception probe 22.

The opening H1' of the reception probe 22 is situated at a predetermined distance from the opening H1 of the transmission probe 21 in the Y-axis direction to face the opening H1 of the transmission probe 21, and the opening H2' of the reception probe 22 is situated at the predetermined distance from the opening H2 of the transmission probe 21 in the Y-axis direction to face the opening H2 of the transmission probe 21.

As described above, the transmission probe 21 and the reception probe 22 in the sensor head 20B of the present embodiment have different probe lengths. This results in providing effects similar to those provided by the first embodiment described above.

It is assumed that, as illustrated in FIG. 14, a (signal transmission) path from the base end of the transmission probe 21 to a predetermined location that is situated before a folded section and faces the opening H2 is path 1, a path from the predetermined location to the opening H1 is path 2, and a path from the base end of the reception probe 22 to the opening H2' is path 3.

Further, it is assumed that a path from the opening H2' to the opening H1' is path 4, a path (medium) from the opening H2 to the opening H2' is path 5, a path (medium) from the opening H1 to the opening H1' is path 6, and a path from the opening H1 to the opening H2 through the fold portion 42 is path 7. Here, path 1=path 3, path 2=path 4≠path 7, and path 5=path 6.

The case in which the signal F is transmitted from the transmission probe 21 to the reception probe 22 through the opening H2, is considered.

A primary path with which a response output is obtained is "path 1→path 2→path 7→path 5→path 3". A total (path) length in this case is obtained by "path 1×2+path 5×1+path 7×1". Another path is "path 1→path 2→path 7→path 7→path 7→path 5→path 3 (reflection at the opening H1)". A total length in this case is obtained by "path 1×2+path 2×1+path 5×1+path 7×3".

Yet another path is "path 1→path 2→path 7→path 5→path 4→path 4→path 3 (reflection at the opening H1')". A total length in this case is obtained by "path 1×2+path 2×3+path 5×1+path 7×1". Yet another path is "path 1→path 2→path 7→path 7→path 7→path 5→path 4→path 4→path 3 (reflection at the opening H1 and the opening H1')". A total length in this case is obtained by "path 1×2+path 2×3+path 5×1+path 7×3".

Next, the case in which the signal F is transmitted from the transmission probe 21 to the reception probe 22 through the opening H1, is considered.

A primary path with which a response output is obtained is "path 1→path 2→path 6→path 4→path 3". A total (path) length in this case is obtained by "path 1×2+path 2×2+path 5×1". Another path is "path 1→path 2→path 7→path 7→path 6→path 4→path 3 (reflection at the opening H2). A total length in this case is obtained by "path 1×2+path 2×2+path 5×1+path 7×2".

Yet another path is "path 1→path 2→path 6→path 4→path 4→path 4→path 3 (reflection at the opening H2')". A total length in this case is obtained by "path 1×2+path 2×4+path 5×1". Yet another path is "path 1→path 2→path 7→path 7→path 6→path 4→path 4→path 4→path 3 (reflection at the opening H2 and the opening H2')". A total length in this case is obtained by "path 1×2+path 2×4+path 5×1+path 7×2".

when, as illustrated in FIG. 14, the opening H2 is provided to the tip of the transmission probe 21 under the conditions that the transmission probe 21 and the reception probe 22 are arranged parallel to each other, and "path 1=path 3", "path 2=path 4≠path 7", and "path 5=path 6" are satisfied, none of the path patterns described above provide equal propagation lengths (total lengths). Here, path 7 has a larger path length than path 2 and path 4 since path 7 includes the fold portion 42.

Further, none of the path patterns described above will provide equal propagation lengths even if there is a change in a distance corresponding to path 5 and/or path 6, which will be described later.

As described above, none of the patterns of the paths passing through the openings H1 and H2 provide equal total lengths. In other words, the total lengths provided by all of the signal transmission patterns described above are different.

Accordingly, power peaks (response outputs) of respective signal-transmission-path patterns are separated (do not overlap) on the temporal axis. Thus, the sensor head 20B of FIG. 14 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Note that the fold portion 42 is not limited to the example of being provided to the transmission probe 21, and the fold portion 42 may be provided to the reception probe 22. In this case, effects similar to those described above are also provided.

Third Embodiment

Figure 15:
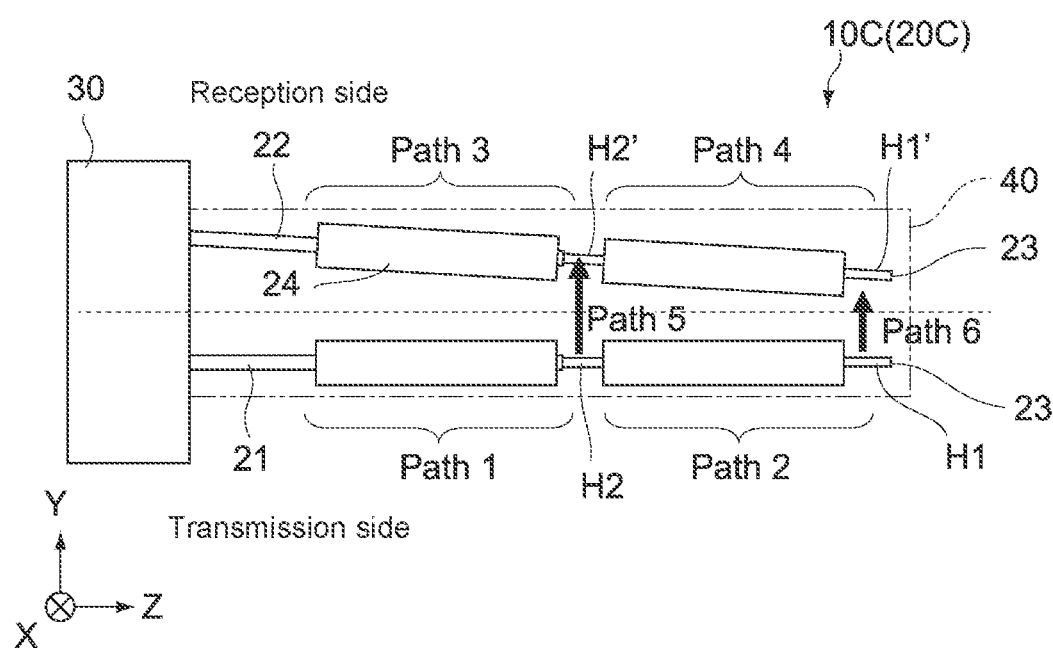
FIG. 15 schematically illustrates a configuration of a sensor apparatus according to a third embodiment of the present technology.

FIG. 15 schematically illustrates a configuration of a sensor apparatus 10C according to a third embodiment of the present technology.

The sensor apparatus 10C of the present embodiment includes a sensor head 20C and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

The present embodiment is different from the first and second embodiments in that a distance between a first tiny antenna section for transmission and a first tiny antenna section for reception and a distance between a second tiny antenna section for transmission and a second tiny antenna section for reception are different from each other.

In the sensor head 20C of the present embodiment, the transmission probe 21 has a linear shape parallel to the Z-axis direction. The opening H1 serving as a first tiny antenna section for transmission is provided to the tip 23 of the transmission probe 21, and the opening H2 serving as a second tiny antenna section for transmission is provided to a portion situated midway between the base end and the tip 23 of the transmission probe 21.

The reception probe 22 has a linear shape inclined at a predetermined angle with respect to the Z-axis direction in the Y-axis direction, and is arranged to not be parallel to the transmission probe 21. The opening H1' serving as a first tiny antenna section for reception is provided to the tip 23 of the reception probe 22, and the opening H2' serving as a second tiny antenna section for reception is provided to a portion situated midway between the base end and the tip 23 of the reception probe 22.

The opening H1' of the reception probe 22 is situated at a predetermined distance from the opening H1 of the transmission probe 21 in the Y-axis direction to face the opening H1 of the transmission probe 21, and the opening H2' of the reception probe 22 is situated at a distance from the opening H2 of the transmission probe 21 in the Y-axis direction to face the opening H2 of the transmission probe 21, the distance being larger than the predetermined distance.

When one of the probes 21 and 22 is inclined with respect to another of the probes 21 and 22, this results in two distances between tiny antenna sections of the respective probes 21 and 22 being different, as described above.

It is assumed that, as illustrated in FIG. 15, a (signal transmission) path from the base end of the transmission probe 21 to the opening H2 is path 1, a path from the opening H2 to the opening H1 is path 2, and a path from the base end of the reception probe 22 to the opening H2' is path 3.

Further, it is assumed that a path from the opening H2' to the opening H1' is path 4, a path (medium) from the opening H2 to the opening H2' is path 5, and a path (medium) from the opening H1 to the opening H1' is path 6. Here, path 5≠path 6, path 1=path 3, and path 2=path 4.

The case in which the signal F is transmitted from the transmission probe 21 to the reception probe 22 through the opening H2, is considered.

A primary path with which a response output is obtained is "path 1→path 5→path 3". A total (path) length in this case is obtained by "path 1×1+path 3×1+path 5×1". Another path is "path 1→path 2→path 2→path 5→path 3 (reflection at the opening H1)". A total length in this case is obtained by "path 1×1+path 2×2+path 3×1+path 5×1". Yet another path is "path 1→path 5→path 4→path 4→path 3 (reflection at the opening H1')". A total length in this case is obtained by "path 1×1+path 3×1+path 4×2+path 5×1". Yet another path is "path 1→path 2→path 2→path 5→path 4→path 4→path 3 (reflection at the opening H1 and the opening H1')". A total length in this case is obtained by "path 1×1+path 2×2+path 3×1+path 4×2+path 5×1".

Next, the case in which the signal F is transmitted from the transmission probe 21 to the reception probe 22 through the opening H1, is considered.

A primary path with which a response output is obtained is "path 1→path 2→path 6→path 4→path 3". A total (path) length in this case is obtained by "path 1×1+path 2×1+path 3×1+path 4×1+path 6×1". Another path is "path 1→path 2→path 2→path 2→path 6→path 4→path 3 (reflection at the opening H2). A total length in this case is obtained by "path 1×1+path 2×3+path 3×1+path 4×1+path 6×1".

Yet another path is "path 1→path 2→path 6→path 4→path 4→path 4→path 3 (reflection at the opening H2')". A total length in this case is obtained by "path 1×1+path 2×1+path 3×1+path 4×3+path 6×1". Yet another path is "path 1→path 2→path 2→path 2→path 6→path 4→path 4→path 4 path 3 (reflection at the opening H2 and the opening H2')". A total length in this case is obtained by "path 1×1+path 2×3+path 3×1+path 4×3+path 6×1".

When, as illustrated in FIG. 15, the openings H2 and H2' are provided under the conditions that the transmission probe 21 is arranged to be inclined at a predetermined angle with respect to the reception probe 22 (such that the transmission probe 21 and the reception probe 22 are asymmetrically arranged), and "path 5≠path 6", "path 1=path 3", and "path 2=path 4" are satisfied, none of the path patterns described above provide equal propagation lengths (total lengths).

As described above, none of the patterns of the paths passing through the openings H1 and H2 provide equal total lengths. In other words, the total lengths provided by all of the signal transmission patterns described above are different.

Accordingly, power peaks (response outputs) of respective signal-transmission-path patterns are separated (do not overlap) on the temporal axis. Thus, the sensor head 20C of FIG. 15 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Note that, when the transmission probe 21 and the reception probe 22 are not parallel to each other, the probe is more likely to be unintentionally deformed (such as being bent) or an air space is more likely to be formed around the probe upon embedding the sensor head 20C in a medium such as soil. In this case, the sensor head 20C may further include a support 40 (refer to FIG. 15) that supports the two probes 21 and 22 in a state of not being parallel to each other. The support 40 may be, for example, a wiring substrate. In this case, the probes 21 and 22 can be formed on the wiring substrate. The support 40 can be similarly applied to the first and second embodiments and embodiments described later.

Fourth Embodiment

Figure 16:
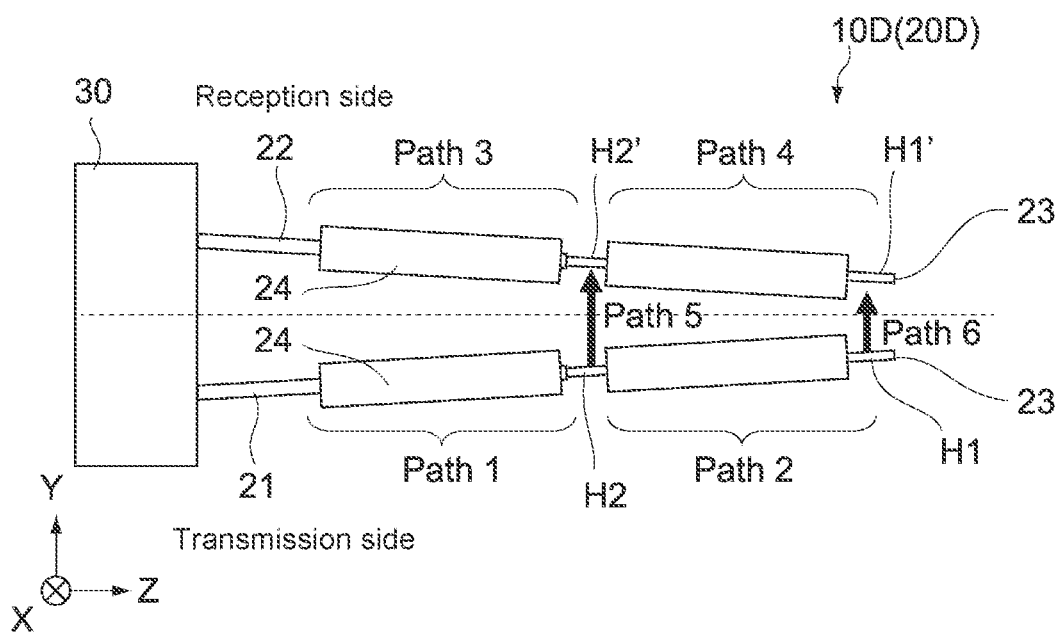
FIG. 16 schematically illustrates a configuration of a sensor apparatus according to a fourth embodiment of the present technology.

FIG. 16 schematically illustrates a configuration of a sensor apparatus 10D according to a fourth embodiment of the present technology.

The sensor apparatus 10D of the present embodiment includes a sensor head 20D and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

The present embodiment is different from the first and second embodiments in that a distance between a first tiny antenna section for transmission and a first tiny antenna section for reception and a distance between a second tiny antenna section for transmission and a second tiny antenna section for reception are different from each other.

Further, the present embodiment is different from the third embodiment in that the transmission probe 21 and the reception probe 22 are each arranged to be inclined with respect to the Z-axis direction such that the respective tips 23 of the transmission probe 21 and the reception probe 22 are situated closer to each other.

In the transmission probe 21, the opening H1 serving as a first tiny antenna section for transmission is provided to the tip 23 of the transmission probe 21, and the opening H2 serving as a second tiny antenna section for transmission is provided to a portion situated midway between the base end and the tip 23 of the transmission probe 21.

The reception probe 22 has a probe length equal to the probe length of the transmission probe 21, and is arranged to not be parallel to the transmission probe 21. The opening H1' serving as a first tiny antenna section for reception is provided to the tip 23 of the reception probe 22, and the opening H2' serving as a second tiny antenna section for reception is provided to a portion situated midway between the base end and the tip 23 of the reception probe 22.

The opening H1' of the reception probe 22 is situated at a predetermined distance from the opening H1 of the transmission probe 21 in the Y-axis direction to face the opening H1 of the transmission probe 21, and the opening H2' of the reception probe 22 is situated at a distance from the opening H2 of the transmission probe 21 in the Y-axis direction to face the opening H2 of the transmission probe 21, the distance being larger than the predetermined distance.

When one of the probes 21 and 22 is inclined with respect to another of the probes 21 and 22, this results in two distances between tiny antenna sections of the respective probes 21 and 22 being different, as described above.

It is assumed that, as illustrated in FIG. 16, a (signal transmission) path from the base end of the transmission probe 21 to the opening H2 is path 1, a path from the opening H2 to the opening H1 is path 2, and a path from the base end of the reception probe 22 to the opening H2' is path 3.

Further, it is assumed that a path from the opening H2' to the opening H1' is path 4, a (space) path from the opening H2 to the opening H2' is path 5, and a (space) path from the opening H1 to the opening H1' is path 6. Here, path 5≠path 6, path 1=path 3, and path 2=path 4.

The case in which the signal F is transmitted from the transmission probe 21 to the reception probe 22 through the opening H2, is considered.

A primary path with which a response output is obtained is "path 1→path 5→path 3". A total (path) length in this case is obtained by "path 1×2+path 5×1". Another path is "path 1→path 2→path 2→path 5→path 3 (reflection at the opening H1)". A total length in this case is obtained by "path 1×2+path 2×2+path 5×1".

Yet another path is "path 1→path 5→path 4→path 4→path 3 (reflection at the opening H1')". A total length in this case is obtained by "path 1×2+path 2×2+path 5×1". Yet another path is "path 1→path 2→path 2→path 5→path 4→path 4→path 3 (reflection at the opening H1 and the opening H1')". A total length in this case is obtained by "path 1×2+path 2×4+path 5×1".

Next, the case in which the signal F is transmitted from the transmission probe 21 to the reception probe 22 through the opening H1, is considered.

A primary path with which a response output is obtained is "path 1→path 2→path 6→path 4→path 3". A total (path) length in this case is obtained by "path 1×2+path 2×2+path 6×1". Another path is "path 1→path 2→path 2→path 2→path 6→path 4→path 3 (reflection at the opening H2). A total length in this case is obtained by "path 1×2+path 2×4+path 6×1".

Yet another path is "path 1→path 2→path 6→path 4→path 4→path 4→path 3 (reflection at the opening H2')". A total length in this case is obtained by "path 1×2+path 2×4+path 6×1". Yet another path is "path 1→path 2→path 2→path 2→path 6→path 4→path 4→path 4→path 3 (reflection at the opening H2 and the opening H2')". A total length in this case is obtained by "path 1×2+path 2×6+path 6×1".

When, as illustrated in FIG. 16, the openings H2 and H2' are provided under the conditions that the transmission probe 21 and the reception probe 22 are each arranged to be inclined at a predetermined angle (such that the transmission probe 21 and the reception probe 22 are symmetrically arranged), and "path 5 path 6", "path 1=path 3", and "path 2=path 4" are satisfied, some of all of the path patterns described above do not provide equal propagation lengths (total lengths).

Here, the path pattern in which a reflection is performed at the opening H1, and the path pattern in which a reflection is performed at the opening H1' provide equal propagation lengths. Further, the path pattern in which a reflection is performed at the opening H2, and the path pattern in which a reflection is performed at the opening H2' provide equal propagation lengths.

However, the propagation lengths of the two sets of equal propagation lengths are not equal to the propagation length of the primary path, and thus there is a time difference in response output. Therefore, the response outputs can be easily separated, and this results in causing no noise.

As described above, some of all of the patterns of the paths passing through the openings H1 and H2 provide equal total lengths. However, the total lengths provided by all of the path patterns described above are different from the total length of the primary path.

Accordingly, power peaks (response outputs) of respective signal-transmission-path patterns are separated at important points on the temporal axis (an overlap of power peaks does not occur with respect to the primary path). Thus, the sensor head 20D of FIG. 16 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Fifth Embodiment

Figure 17:
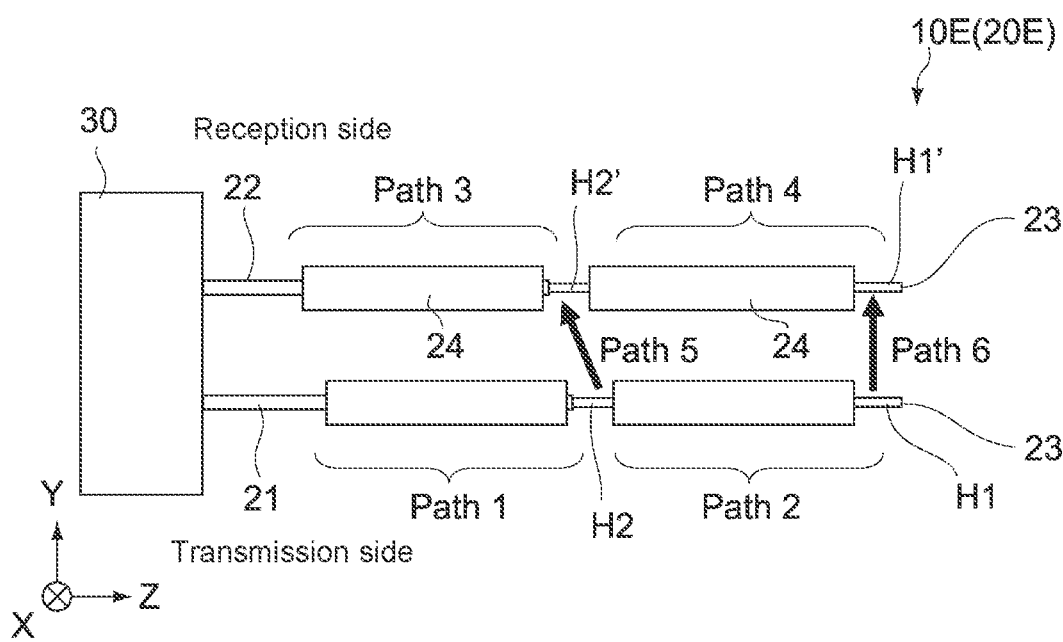
FIG. 17 schematically illustrates a configuration of a sensor apparatus according to a fifth embodiment of the present technology.

FIG. 17 schematically illustrates a configuration of a sensor apparatus 10E according to a fifth embodiment of the present technology.

The sensor apparatus 10E of the present embodiment includes a sensor head 20E and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

The present embodiment is different from the first and second embodiments in that a distance between a first tiny antenna section for transmission and a first tiny antenna section for reception and a distance between a second tiny antenna section for transmission and a second tiny antenna section for reception are different from each other.

Further, the present embodiment is different from the third and fourth embodiments in that the transmission probe 21 and the reception probe 22 have equal probe lengths, and are each arranged parallel to the Z-axis direction.

In the transmission probe 21, the opening H1 serving as a first tiny antenna section for transmission is provided to the tip 23 of the transmission probe 21, and the opening H2 serving as a second tiny antenna section for transmission is provided to a portion situated midway between the base end and the tip 23 of the transmission probe 21.

The reception probe 22 has a probe length equal to the probe length of the transmission probe 21, and is arranged to be parallel to the transmission probe 21. The opening H1' serving as a first tiny antenna section for reception is provided to the tip 23 of the reception probe 22, and the opening H2' serving as a second tiny antenna section for reception is provided to a portion situated midway between the base end and the tip 23 of the reception probe 22.

The opening H1' of the reception probe 22 is situated at a predetermined distance from the opening H1 of the transmission probe 21 in the Y-axis direction to face the opening H1 of the transmission probe 21. The opening H2' of the reception probe 22 is arranged to be situated closer to the base end of the reception probe 22, compared to a distance at which the opening H2 of the transmission probe 21 is situated from the base end of the transmission probe 21, and this results in the opening H2' being situated at a distance from the opening H2 to face the opening H2, the distance being larger than the predetermined distance.

When the opening H2' is shifted relative to the opening H2 in the Z-axis direction by a predetermined shift amount, this results in two distances between tiny antenna sections of the respective probes 21 and 22 being different, as described above. The amount of shifting the opening H2' relative to the opening H2 is not particularly limited, and is, for example, 5% or more of a probe length.

It is assumed that, as illustrated in FIG. 17, a (signal transmission) path from the base end of the transmission probe 21 to the opening H2 is path 1, a path from the opening H2 to the opening H1 is path 2, and a path from the base end of the reception probe 22 to the opening H2' is path 3.

Further, it is assumed that a path from the opening H2' to the opening H1' is path 4, a path (medium) from the opening H2 to the opening H2' is path 5, and a path (medium) from the opening H1 to the opening H1' is path 6. Here, path 1≠path 3, path 2=path 4, and path 5≠path 6.

The case in which the signal F is transmitted from the transmission probe 21 to the reception probe 22 through the opening H2, is considered.

A primary path with which a response output is obtained is "path 1→path 5→path 3". A total (path) length in this case is obtained by "path 1×1+path 3×1+path 5×1". Another path is "path 1→path 2→path 2→path 5→path 3 (reflection at the opening H1)". A total length in this case is obtained by "path 1×1+path 2×2+path 3×1+path 5×1".

Yet another path is "path 1→path 5→path 4→path 4→path 3 (reflection at the opening H1')". A total length in this case is obtained by "path 1×1+path 2×2+path 3×1+path 5×1". Yet another path is "path 1→path 2→path 2→path 5→path 4→path 4→path 3 (reflection at the opening H1 and the opening H1')". A total length in this case is obtained by "path 1×1+path 2×4+path 3×1+path 5×1".

Next, the case in which the signal F is transmitted from the transmission probe 21 to the reception probe 22 through the opening H1, is considered.

A primary path with which a response output is obtained is "path 1→path 2→path 6→path 4→path 3". A total (path) length in this case is obtained by "path 1×1+path 2×2+path 3×1+path 6×1". Another path is "path 1→path 2→path 2→path 2→path 6→path 4→path 3 (reflection at the opening H2). A total length in this case is obtained by "path 1×1+path 2×4+path 3×1+path 6×1".

Yet another path is "path 1→path 2→path 6→path 4→path 4→path 4→path 3 (reflection at the opening H2')". A total length in this case is obtained by "path 1×1+path 2×4+path 3×1+path 6×1". Yet another path is "path 1→path 2→path 2→path 2→path 6→path 4→path 4→path 3 (reflection at the opening H2 and the opening H2')". A total length in this case is obtained by "path 1×1+path 2×6+path 3×1+path 6×1".

When, as illustrated in FIG. 17, the openings H2 and H2' are provided under the conditions that the transmission probe 21 and the reception probe 22 are arranged parallel to each other, and "path 1≠path 3", "path 2=path 4", and "path 5≠path 6" are satisfied, some of all of the path patterns described above do not provide equal propagation lengths (total lengths).

Here, the path pattern in which a reflection is performed at the opening H1, and the path pattern in which a reflection is performed at the opening H1' provide equal propagation lengths. Further, the path pattern in which a reflection is performed at the opening H2, and the path pattern in which a reflection is performed at the opening H2' provide equal propagation lengths.

However, the propagation lengths of the two sets of equal propagation lengths are not equal to the propagation length of the primary path, and thus there is a time difference in response output. Therefore, the response outputs can be easily separated, and this results in causing no noise.

As described above, some of all of the patterns of the paths passing through the openings H1 and H2 provide equal total lengths. However, the total lengths provided by all of the path patterns described above are different from the total length of the primary path.

Accordingly, power peaks (response outputs) of respective signal-transmission-path patterns are separated at important points on the temporal axis (an overlap of power peaks does not occur with respect to the primary path). Thus, the sensor head 20E of FIG. 17 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Comparative Example 2

Figure 18:
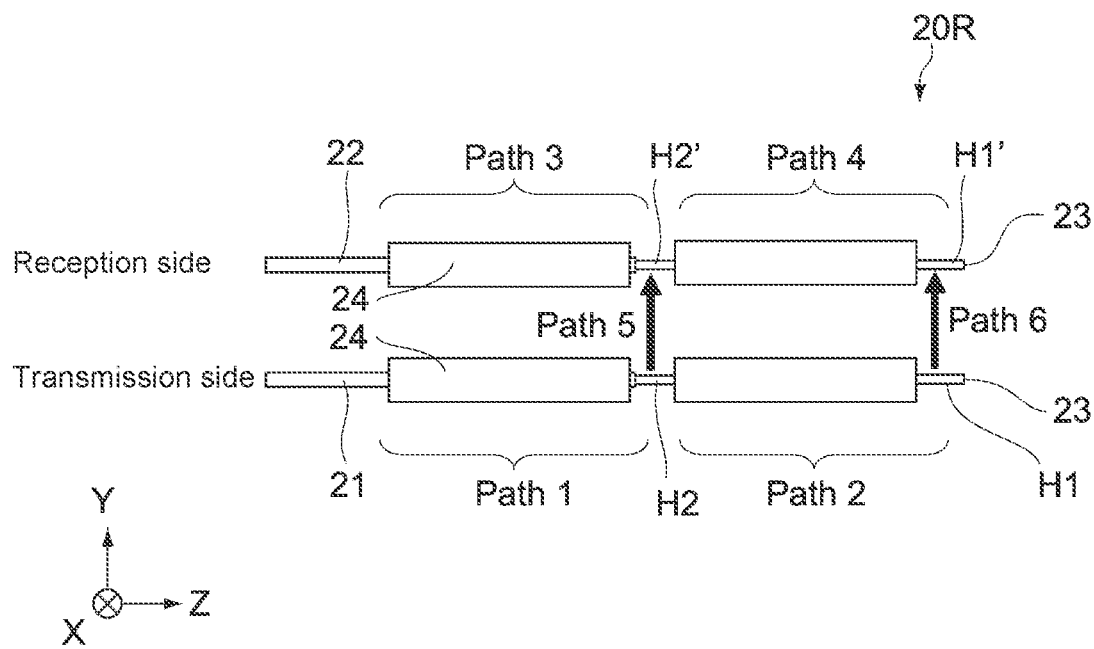
FIG. 18 schematically illustrates a configuration of a sensor head according to Comparative Example 2.

FIG. 18 schematically illustrates a configuration of a sensor head 20R according to Comparative Example 2.

The sensor head 20R according to Comparative Example 2 has a configuration similar to the configuration of a sensor head of the sensor apparatus 10' of Comparative Example 1 described with reference to FIG. 5.

In other words, in the sensor head 20R, the transmission probe 21 and the reception probe 22 have equal probe lengths, and are each arranged parallel to the Z-axis direction. The opening H1 and the opening H1' are situated at a distance from each other in the Y-axis direction to face each other, and the opening H2 and the opening H2' are situated at the distance from each other in the Y-axis direction to face each other.

It is assumed that, as illustrated in FIG. 18, a (signal transmission) path from the base end of the transmission probe 21 to the opening H2 is path 1, a path from the opening H2 to the opening H1 is path 2, and a path from the base end of the reception probe 22 to the opening H2' is path 3.

Further, it is assumed that a path from the opening H2' to the opening H1' is path 4, a (space) path from the opening H2 to the opening H2' is path 5, and a (space) path from the opening H1 to the opening H1' is path 6. Here, path 1=path 3, path 2=path 4, and path 5=path 6.

The case in which the signal F is transmitted from the transmission probe 21 to the reception probe 22 through the opening H2, is considered.

A primary path with which a response output is obtained is "path 1→path 5→path 3". A total (path) length in this case is obtained by "path 1×2+path 5×1". Another path is "path 1→path 2→path 2→path 5→path 3 (reflection at the opening H1)". A total length in this case is obtained by "path 1×2+path 2×2+path 5×1".

Yet another path is "path 1→path 5→path 4→path 4→path 3 (reflection at the opening H1')". A total length in this case is obtained by "path 1×2+path 2×2+path 5×1". Yet another path is "path 1→path 2→path 2→path 5→path 4→path 4→path 3 (reflection at the opening H1 and the opening H1')". A total length in this case is obtained by "path 1×2+path 2×4+path 5×1".

Next, the case in which the signal F is transmitted from the transmission probe 21 to the reception probe 22 through the opening H1, is considered.

A primary path with which a response output is obtained is "path 1→path 2→path 6→path 4→path 3". A total (path) length in this case is obtained by "path 1×2+path 2×2+path 5×1". Another path is "path 1→path 2→path 2→path 2→path 6→path 4→path 3 (reflection at the opening H2). A total length in this case is obtained by "path 1×2+path 2×4+path 5×1".

Yet another path is "path is path 1→path 2→path 6→path 4→path 4→path 4→path 3 (reflection at the opening H2')". A total length in this case is obtained by "path 1×2+path 2×4+path 5×1". Yet another path is "path 1→path 2→path 2→path 2→path 6→path 4→path 4→path 4→path 3 (reflection at the opening H2 and the opening H2')". A total length in this case is obtained by "path 1×2+path 2×5+path 5×1".

When, as illustrated in FIG. 18, the openings H2 and H2' are provided under the conditions that the transmission probe 21 and the reception probe 22 are arranged parallel to each other, and "path 1=path 3", "path 2=path 4", and "path 5=path 6" are satisfied, the path pattern in which a reflection is performed at the opening H1, and the path pattern in which a reflection is performed at the opening H1' provide equal propagation lengths. Further, the path pattern in which a reflection is performed at the opening H2, and the path pattern in which a reflection is performed at the opening H2' provide equal propagation lengths.

Then, the equal propagation lengths provided when reflections are performed at the openings H1 and H1' are equal to the propagation length of the primary path. This results in causing an error in measurement.

(When there are Three Openings)

Sixth Embodiment

Figure 19:
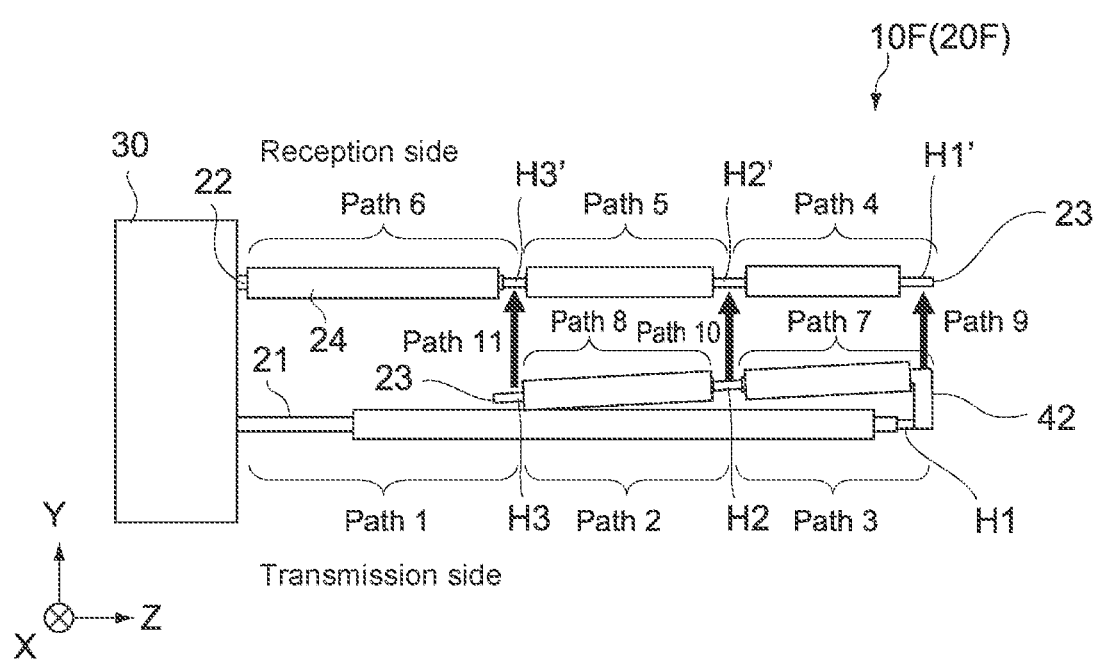
FIG. 19 schematically illustrates a configuration of a sensor apparatus according to a sixth embodiment of the present technology.

FIG. 19 schematically illustrates a configuration of a sensor apparatus 10F according to a sixth embodiment of the present technology.

The sensor apparatus 10F of the present embodiment includes a sensor head 20F and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

The sensor head 20F of the present embodiment is different from the first to fifth embodiments described above in that the transmission probe 21 includes an opening H3 that serves as a third tiny antenna section for transmission, and the reception probe 22 includes an opening H3' that serves as a third tiny antenna section for transmission.

In the present embodiment, the transmission probe 21 is arranged parallel to the Z-axis direction, and includes the fold portion 42 causing the tip 23 of the transmission probe 21 to be oppositely oriented in a direction of the measurement unit 30. The fold portion 42 causes the transmission probe 21 to be oppositely oriented by reversing the transmission probe 21 at an angle greater than 180 degrees, such that a portion from the fold portion 42 to the tip 23 of the transmission probe 21 is not parallel to a portion from the base end to the fold portion 42 of the transmission probe 21. An angle at which the portion from the fold portion 42 to the tip 23 is inclined with respect to the Z-axis direction is not particularly limited, and may be, for example, greater than or equal to 5 degrees and less than or equal to 10 degrees.

The opening H1 is provided to the fold portion 42, and the opening H2 is provided to a portion situated midway between the fold portion 42 and the tip 23 of the transmission probe 21. The opening H3 is provided to the tip of the transmission probe 21.

The reception probe 22 is arranged parallel to the Z-axis direction, and has a probe length that is equal to a length from the base end of the transmission probe 21 to the fold portion 42. The opening H1' is provided to the tip 23 of the reception probe 22, and the opening H2' is provided to a portion situated midway between the base end and the tip 23 of the reception probe 22. The opening H3' is provided to a portion situated midway between the base end and the tip 23 of the reception probe 22.

The opening H1' of the reception probe 22 is situated at a predetermined distance from the opening H1 of the transmission probe 21 in the Y-axis direction to face the opening H1 of the transmission probe 21, and the opening H2' of the reception probe 22 is situated at a distance from the opening H2 of the transmission probe 21 in the Y-axis direction to face the opening H2 of the transmission probe 21, the distance being larger than the predetermined distance. Further, the opening H3' of the reception probe 22 is situated at a distance from the opening H3 of the transmission probe 21 in the Y-axis direction to face the opening H3 of the transmission probe 21, the distance between the openings H3 and H3' being larger than the distances between the other openings (that is, the distance between the openings H1 and H1' and the distance between the openings H2 and H2').

The measurement unit 30 generates the measurement signal S1 further including information regarding the characteristics of a propagation of an electromagnetic wave in a medium between the opening H3 and the opening H3'. In the present embodiment, the distance between the openings H1 and H1', the distance between the openings H2 and H2', and the distance between the openings H3 and H3' are different from each other. This results in providing effects similar to those provided by the first embodiment described above.

It is assumed that, as illustrated in FIG. 19, a (signal transmission) path from the base end of the transmission probe 21 to a first predetermined location that is situated before a folded section and faces the opening H3 is path 1, a path from the first predetermined location to a second predetermined location that faces the opening H2 is path 2, and a path from the second predetermined location to the opening H1 is path 3.

It is assumed that a path from the opening H1 to the opening H2 through the folded section is path 7, and a path from the opening H2 to the opening H3 is path 8.

It is assumed that a path from the tip (H1') of the reception probe 22 to the opening H2' is path 4. Further, it is assumed that a path from the opening H2' to the opening H3' is path 5, and a path from the opening H3' to the base end is path 6. Furthermore, it is assumed that a path (medium) from the opening H1 to the opening H1' is path 9, a path (medium) from the opening H2 to the opening H2' is path 10, and a path (medium) from the opening H3 to the opening H3' is path 11. Here, path 1=path 6, path 2=path 5, path 3=path 4, and path 9≠path 10≠path 11.

The case in which the signal F is transmitted from the transmission probe 21 to the reception probe 22 through the opening H3, is considered.

A primary path with which a response output is obtained is "path 1→path 2→path 3→path 7→path 8→path 11→path 6". A total (path) length in this case is obtained by "path 1×2+path 2×1+path 3×1+path 7×1+path 8×1+path 11×1". Another path is "path 1→path 2→path 3→path 7→path 8→path 11→path 5→path 5→path 6 (reflection at the opening H2')". A total length in this case is obtained by "path 1×2+path 2×3+path 3×1+path 7×1+path 8×1+path 11×1". Yet another path is "path 1→path 2→path 3→path 7→path 8→path 11→path 5→path 4→path 4→path 5→path 6 (reflection at the opening H1')". A total length in this case is obtained by "path 1×2+path 2×3+path 3×1+path 7×3+path 8×1+path 11×1".

Yet another path is "path 1→path 2→path 3→path 7→path 8→path 8→path 8→path 11→path 6 (reflection at the opening H2)". A total length in this case is obtained by "path 1×2+path 2×1+path 3×1+path 7×1+path 8×3+path 11×1". Yet another path is "path 1→path 2→path 3→path 7→path 8→path 8→path 7→path 7→path 8→path 11→path 6 (reflection at the opening H1)". A total length in this case is obtained by "path 1×2+path 2×1+path 3×1+path 7×3+path 8×3+path 11×1".

Moreover, there is a pattern in which a reflection is performed at path 7 and path 8 and then a reflection is performed at path 5 and path 4. However, a total length provided by the pattern is very different from the total length of the primary path. Thus, a description thereof is omitted.

Next, the case in which the signal F is transmitted from the transmission probe 21 to the reception probe 22 through the opening H2, is considered.

A primary path with which a highest (response) output of power is obtained is "path 1→path 2→path 3→path 7→path 10→path 5→path 6". A total (path) length in this case is obtained by "path 1×2+path 2×2+path 3×1+path 7×1+path 10×1". Another path is "path 1→path 2→path 3→path 7→path 10→path 4→path 4→path 5→path 6 (reflection at the opening H1'). A total length in this case is obtained by "path 1×2+path 2×2+path 3×3+path 7×1+path 10×1".

Yet another path is "path 1→path 2→path 3→path 7→path 7→path 7→path 10→path 5→path 6 (reflection at the opening H3)". A total length in this case is obtained by "path 1×2+path 2×2+path 3×1+path 7×3+path 10×1+path 8×2". Yet another path is "path 1→path 2→path 3→path 7→path 8→path 8→path 10→path 5→path 6 (reflection at the opening H1)". A total length in this case is obtained by "path 1×2+path 2×2+path 3×1+path 7×1+path 10×1+path 8×2".

Yet another path is "path 1→path 2→path 3→path 7→path 10→path 5→path 5→path 5→path 6 (reflection at the opening H3')". A total length in this case is obtained by "path 1×2+path 2×4+path 7×1+path 10×1+path 8×2".

Yet another path is "path 1→path 2→path 3→path 7→path 8→path 8→path 10→path 4→path 4→path 5→path 6 (reflection at the opening H1 and the opening H1')". A total length in this case is obtained by "path 1×2+path 2×2+path 3×3+path 7×1+path 10×1+path 8×2". Yet another path is "path 1→path 2→path 3→path 7→path 7→path 7→path 10→path 4→path 4→path 5→path 6 (reflection at the opening H3 and the opening H1')". A total length in this case is obtained by "path 1×2+path 2×2+path 3×3+path 7×3+path 10×1+path 8×2".

Next, the case in which the signal F is transmitted from the transmission probe 21 to the reception probe 22 through the opening H1, is considered.

A primary path with which a response output is obtained is "path 1→path 2→path 3→path 9→path 4→path 5→path 6". A total (path) length in this case is obtained by "path 1×2+path 2×2+path 3×2+path 9×1". Another path is "path 1→path 2→path 3→path 7→path 7→path 9→path 4→path 5→path 6 (reflection at the opening H2). A total length in this case is obtained by "path 1×2+path 2×2+path 3×2+path 9×1+path 7×2".

Yet another path is "path 1→path 2→path 3→path 7→path 8→path 8→path 7→path 9→path 4→path 5→path 6 (reflection at the opening H3)". A total length in this case is obtained by "path 1×2+path 2×2+path 3×2+path 9×1+path 7×2+path 8×2". Yet another path is "path 1→path 2→path 3→path 9→path 4→path 4→path 4→path 5, path 6 (reflection at the opening H2')". A total length in this case is obtained by "path 1×2+path 2×2+path 3×3+path 9×1".

Yet another path is "path 1→path 2→path 3→path 9→path 4→path 5→path 5→path 4→path 4→path 5→path 6 (reflection at the opening H3')". A total length in this case is obtained by "path 1×2+path 2×4+path 3×3+path 9×1". Yet another path is "path 1→path 2→path 3→path 7→path 7→path 9→path 4→path 4→path 4→path 5→path 6 (reflection at the opening H2 and the opening H2')". A total length in this case is obtained by "path 1×2+path 2×2+path 3×4+path 9×1+path 7×2".

Moreover, there is also a path pattern in which the signal goes forward after being reflected off the openings H3 and H3'. However, a total length provided by the pattern is very different from the total length of the primary path. Thus, a description thereof is omitted.

When, as illustrated in FIG. 19, the six openings H1 to H3' described above are provided to the transmission probe 21 under the conditions that a coaxial cable that is situated before the folded section of the transmission probe 21 is inclined at a predetermined angle with respect to a coaxial cable that is situated after the folded section of the transmission probe 21 (such that those coaxial cables are asymmetrically arranged), and "path 1=path 6", "path 2=path 5", "path 3=path 4", and "path 9≠path 10≠path 11" are satisfied, none of the path patterns described above provide equal propagation lengths (total lengths).

Moreover, there is also a path pattern in which the signal enters the reception side from the transmission side, and then returns to the transmission side. However, a total length provided by the pattern is very different from the total length of the primary path. Thus, a description thereof is omitted.

As described above, none of the patterns of the paths passing through the openings H1, H2, and H3 provide equal total lengths. In other words, the total lengths provided by all of the signal transmission patterns described above are different.

Accordingly, power peaks (response outputs) of respective signal-transmission-path patterns are separated (do not overlap) on the temporal axis. Thus, the sensor head 20F of FIG. 19 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Seventh Embodiment

Figure 20:
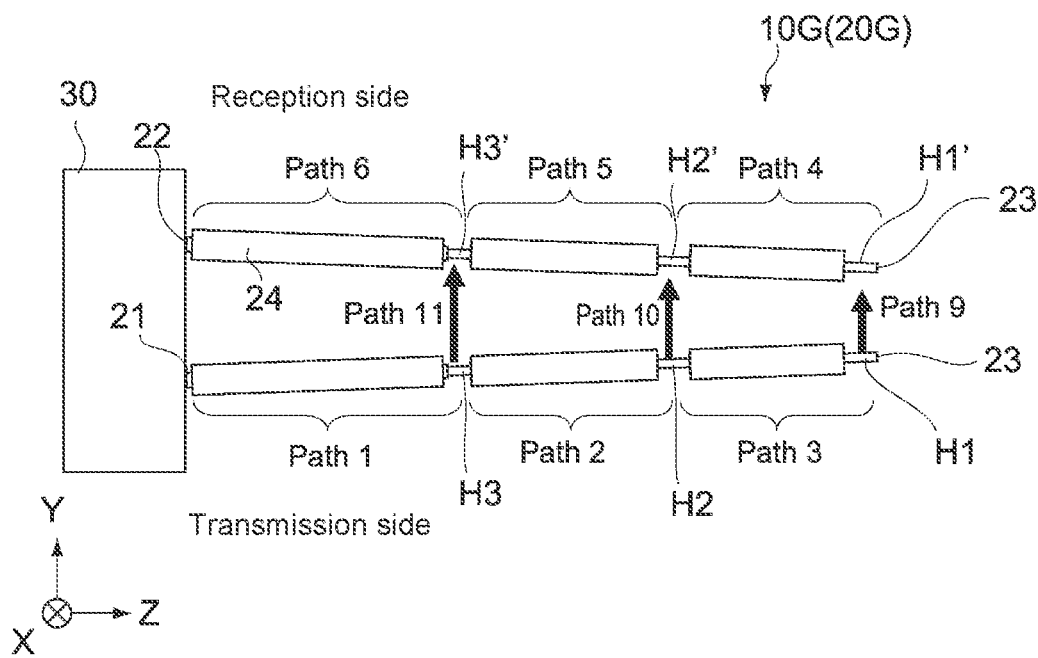
FIG. 20 schematically illustrates a configuration of a sensor apparatus according to a seventh embodiment of the present technology.

FIG. 20 schematically illustrates a configuration of a sensor apparatus 10G according to a seventh embodiment of the present technology.

The sensor apparatus 10G of the present embodiment includes a sensor head 20G and the measurement unit 30. In the following description, a structural element that is different from the structural elements of the first embodiment is primarily described. A structural element that is similar to the structural element of the first embodiment is denoted by a reference numeral similar to the reference numeral used in the first embodiment, and a description thereof is omitted or simplified.

The present embodiment is different from the sixth embodiment in that the transmission probe 21 and the reception probe 22 have equal probe lengths, and are each arranged to be inclined with respect to the Z-axis direction such that the respective tips 23 of the transmission probe 21 and the reception probe 22 are situated closer to each other. An angle at which each of the probes 21 and 22 is inclined with respect to the Z-axis direction is, for example, greater than or equal to 5 degrees and less than or equal to 10 degrees.

The opening H1' of the reception probe 22 is situated at a predetermined distance from the opening H1 of the transmission probe 21 in the Y-axis direction to face the opening H1 of the transmission probe 21, and the opening H2' of the reception probe 22 is situated at a distance from the opening H2 of the transmission probe 21 in the Y-axis direction to face the opening H2 of the transmission probe 21, the distance being larger than the predetermined distance. Further, the opening H3' of the reception probe 22 is situated at a distance from the opening H3 of the transmission probe 21 in the Y-axis direction to face the opening H3 of the transmission probe 21, the distance between the openings H3 and H3' being larger than the distances between the other openings (that is, the distance between the openings H1 and H1' and the distance between the openings H2 and H2'). The ratio of the distance between the base end of the reception probe 22 and the opening H3', the distance between the opening H3' and the opening H2', and the distance between the opening H2' and the opening H1' is not particularly limited, and is, for example, 4:3:3.

It is assumed that, as illustrated in FIG. 20, a (signal transmission) path from the base end of the transmission probe 21 to the opening H3 is path 1, a path from the opening H3 to the opening H2 is path 2, a path from the opening H2 to the opening H1 is path 3, and a path from the tip (the opening H1') of the reception probe 22 to the opening H2' is path 4.

Further, it is assumed that a path from the opening H2' to the opening H3' is path 5, a path from the opening H3' to the base end is path 6, a (space) path from the opening H1 to the opening H1' is path 9, a (space) path from the opening H2 to the opening H2' is path 10, and a (space) path from the opening H3 to the opening H3' is path 11.

Here, path 9≠path 10≠path 11. "path 1=path 6", "path 2=path 5", and "path 3=path 4" are satisfied when a symmetrical arrangement is performed, and "path 1≠path 6", "path 2≠path 5", and "path 3≠path 4" are satisfied when an asymmetrical arrangement is performed.

The case in which the signal F is transmitted from the transmission probe 21 to the reception probe 22 through the opening H3, is considered.

A primary path with which a response output is obtained is "path 1→path 2→path 3→path 3→path 2→path 11→path 6". A total (path) length in this case is obtained by "path 1×2+path 2×2+path 3×2+path 11×1". Another path is "path 1→path 2→path 3→path 3→path 2→path 11→path 5→path 5→path 6 (reflection at the opening H2')". A total length in this case is obtained by "path 1×2+path 2×4+path 3×2+path 11×1". Yet another path is "path 1→path 2→path 3→path 3→path 2→path 11→path 5→path 4→path 4→path 5→path 6 (reflection at the opening H1')". A total length in this case is obtained by "path 1×2+path 2×4+path 3×4+path 11×1".

Yet another path is "path 1→path 2→path 3→path 3→path 2→path 2→path 2→path 11→path 6 (reflection at the opening H2)". A total length in this case is obtained by "path 1×2+path 2×4+path 3×2+path 11×1". Yet another path is "path 1→path 2→path 3→path 3→path 2→path 2→path 3→path 3→path 2→path 11→path 6 (reflection at the opening H3)". A total length in this case is obtained by "path 1×2+path 2×4+path 3×4+path 11×1".

Moreover, there is a pattern in which a reflection is performed at path 3 and path 2 and then a reflection is performed at path 5 and path 4. However, a total length provided by the pattern is very different from the total length of the primary path. Thus, a description thereof is omitted.

Next, the case in which the signal F is transmitted from the transmission probe 21 to the reception probe 22 through the opening H2, is considered.

A primary path with which a response output is obtained is "path 1→path 2→path 3→path 3→path 10→path 5→path 6". A total (path) length in this case is obtained by "path 1×2+path 2×2+path 3×2+path 10×1". Another path is "path 1→path 2→path 3→path 3→path 10→path 4→path 4→path 5→path 6 (reflection at the opening H1'). A total length in this case is obtained by "path 1×2+path 2×2+path 3×4+path 10×1".

Yet another path is "path 1→path 2→path 3→path 3→path 3→path 10→path 5→path 6 (reflection at the opening H3)". A total length in this case is obtained by "path 1×2+path 2×4+path 3×4+path 10×1". Yet another path is "path 1→path 2→path 3→path 3→path 2→path 2→path 10→path 5→path 6 (reflection at the opening H1)". A total length in this case is obtained by "path 1×2+path 2×4+path 3×2+path 10×1".

Yet another path is "path 1→path 2→path 3→path 3→path 10→path 5→path 5→path 5→path 6 (reflection at the opening H3')". A total length in this case is obtained by "path 1×2+path 2×6+path 3×1+path 10×1".

Yet another path is "path 1→path 2→path 3→path 3→path 2→path 2→path 10→path 4→path 4→path 5→path 6 (reflection at the opening H1 and the opening H1')". A total length in this case is obtained by "path 1×2+path 2×4+path 3×4+path 10×1". Yet another path is "path 1→path 2→path 3→path 3→path 3→path 3→path 10→path 4→path 4→path 5→path 6 (reflection at the opening H3 and the opening H1')". A total length in this case is obtained by "path 1×2+path 2×4+path 3×6+path 10×1".

Next, the case in which the signal F is transmitted from the transmission probe 21 to the reception probe 22 through the opening H1, is considered.

A primary path with which a response output is obtained is "path 1→path 2→path 3→path 9→path 4→path 5→path 6". A total (path) length in this case is obtained by "path 1×2+path 2×2+path 3×2+path 9×1". Another path is "path 1→path 2→path 3→path 3→path 3→path 9→path 4→path 5→path 6 (reflection at the opening H2). A total length in this case is obtained by "path 1×2+path 2×2+path 3×4+path 9×1".

Yet another path is "path 1→path 2→path 3→path 3→path 2→path 2→path 3→path 9→path 4→path 5→path 6 (reflection at the opening H1)". A total length in this case is obtained by "path 1×2+path 2×4+path 3×4+path 9×1". Yet another path is "path 1→path 2→path 3→path 9→path 4→path 4→path 4→path 5→path 6 (reflection at the opening H2')". A total length in this case is obtained by "path 1×2+path 2×2+path 3×3+path 9×1".

Yet another path is "path 1→path 2→path 3→path 9→path 4→path 5→path 5→path 4→path 4, path 5→path 6 (reflection at the opening H3')". A total length in this case is obtained by "path 1×2+path 2×4+path 3×3+path 9×1". Yet another path is "path 1→path 2→path 3→path 3→path 3→path 9→path 4→path 4→path 4→path 5→path 6 (reflection at the opening H2 and the opening H2')". A total length in this case is obtained by "path 1×2+path 2×2+path 3×6+path 9×1".

Further, there is also a path pattern in which the signal goes forward after being reflected off the openings H1 and H3'. However, a total length provided by the pattern is very different from the total length of the primary path. Thus, a description thereof is omitted.

Furthermore, there is also a path pattern in which the signal enters the reception side from the transmission side, and then returns to the transmission side. However, a total length provided by the pattern is very different from the total length of the primary path. Thus, a description thereof is omitted.

When, as illustrated in FIG. 20, the openings H3 and H3' are provided under the conditions that the transmission probe 21 and the reception probe 22 are each arranged to be inclined at a predetermined angle with respect to the Z-axis direction, and "path 1=path 6", "path 2=path 5", and "path 3=path 4" are satisfied, some of all of the path patterns described above do not provide equal propagation lengths (total lengths).

Here, the pattern of the path that passes through the opening H3 and in which a reflection is performed at the opening H2, and the pattern of the path that passes through the opening H3 and in which a reflection is performed at the opening H2' provide equal propagation lengths. Further, the pattern of the path that passes through the opening H3 and in which a reflection is performed at the opening H3, and the pattern of the path that passes through the opening H3 and in which a reflection is performed at the opening H1' provide equal propagation lengths.

The pattern of the path that passes through the opening H2 and in which a reflection is performed at the opening H3, and the pattern of the path that passes through the opening H2 and in which a reflection is performed at the opening H1 and the opening H1' provide equal propagation lengths.

However, the propagation lengths of the three sets of equal propagation lengths are not equal to the propagation length of the primary path, and thus there is a time difference in response output. Therefore, the response outputs can be easily separated, and this results in causing no noise.

Alternatively, When the openings H3 and H3' are provided under the conditions that the transmission probe 21 (or the reception probe 22) is arranged to be inclined at a predetermined angle with respect to the reception probe 22 (or the transmission probe 21), and "path 1≠path 6", "path 2≠path 5", and "path 3≠path 4" are satisfied, none of the path patterns described above provide equal propagation lengths (total lengths). In this case, path patterns similar to the path patterns of the third embodiment are provided. Thus, descriptions thereof are omitted.

Accordingly, power peaks (response outputs) of respective signal-transmission-path patterns are separated (do not overlap) on the temporal axis. Thus, the sensor head 20G of FIG. 20 makes it possible to prevent equal measurement distances (total lengths) from being provided by different signal-transmission-path patterns, and thus to reduce an error in measurement. This results in improving the accuracy in the measurement of relative permittivity of a medium or a water amount in the medium.

Comparative Example 3

Figure 21:
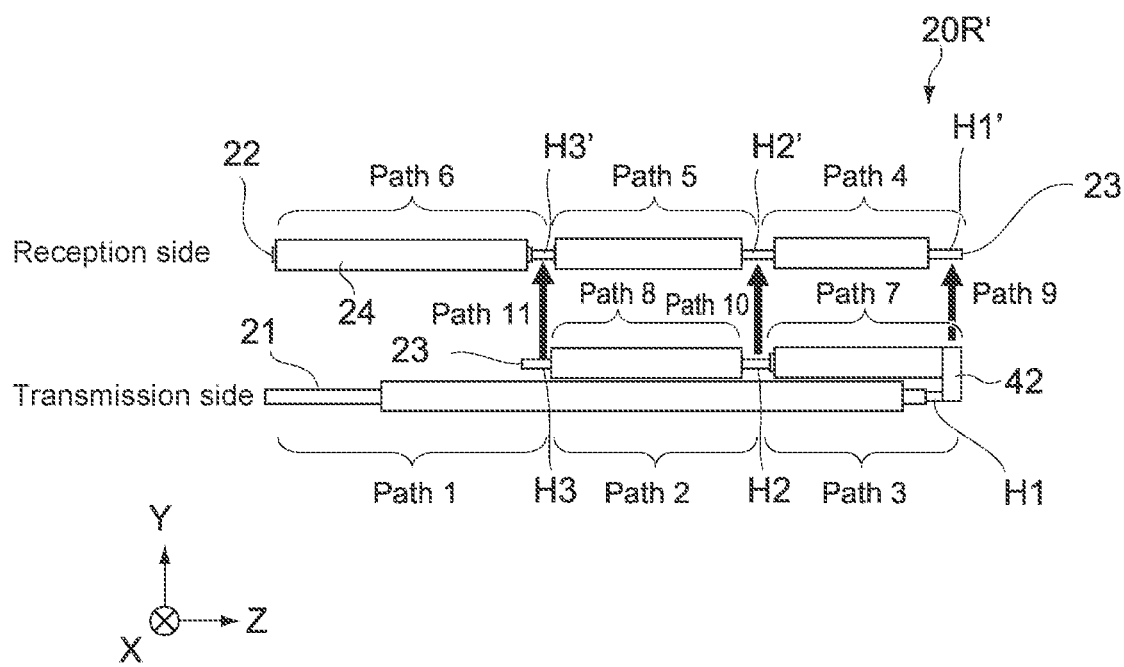
FIG. 21 schematically illustrates a configuration of a sensor head according to Comparative Example 3.

FIG. 21 schematically illustrates a configuration of a sensor head 20R' according to Comparative Example 3.

In the sensor head 20R' according to Comparative Example 3, the transmission probe 21 is arranged parallel to the Z-axis direction. The transmission probe 21 includes the fold portion 42, and a portion from the fold portion 42 to the tip 23 is formed parallel to the Z-axis direction. The opening H1 is provided to the fold portion 42, the opening H2 is provided to the tip 23, and the opening H3 is provided to a portion situated midway between the fold portion 42 and the tip 23.

In the sensor head 20R', the reception probe 22 is arranged parallel to the Z-axis direction, and has a probe length that is equal to a length from the base end of the transmission probe 21 to the fold portion 42. The opening H1' is provided to the tip 23 of the reception probe 22, and is situated at a predetermined distance from the opening H1 of the transmission probe 21 in the Y-axis direction to face the opening H1 of the transmission probe 21. The opening H2' is provided between the base end and the tip 23 of the reception probe 22, and is situated at the predetermined distance from the opening H2 of the transmission probe 21 in the Y-axis direction to face the opening H2 of the transmission probe 21. The opening H3' is provided between the base end and the tip 23 of the reception probe 22, and is situated at the predetermined distance from the opening H3 of the transmission probe 22 in the Y-axis direction to face the opening H3 of the transmission probe 22.

In this example, it is assumed that, as illustrated in FIG. 21, a (signal transmission) path from the base end of the transmission probe 21 to a first predetermined location that is situated before a folded section and faces the opening H3 is path 1, a path from the first predetermined location to a second predetermined location that faces the opening H2 is path 2, and a path from the second predetermined location to the opening H1 is path 3.

Further, it is assumed that a path from the opening H1 to the opening H2 through the folded section is path 7, and a path from the opening H2 to the opening H3 is path 8.

It is assumed that a path from the tip (H1') of the reception probe 22 to the opening H2' is path 4, a path from the opening H2' to the opening H3' is path 5, and a path from the opening H3' to the base end is path 6. Further, it is assumed that a path (medium) from the opening H1 to the opening H1' is path 9, a path (medium) from the opening H2 to the opening H2' is path 10, and a path (medium) from the opening H3 to the opening H3' is path 11.

Here, path 1=path 6, path 2=path 5=path 8, path 3=path 4≠path 7, and path 10=path 11≠path 9.

The case in which the signal F is transmitted from the transmission probe 21 to the reception probe 22 through the opening H3, is considered.

A primary path with which a response output is obtained is "path 1→path 2→path 3→path 7→path 8→path 11→path 6". A total (path) length in this case is obtained by "path 1×2+path 2×2+path 3×1+path 7×1+path 10×1". Another path is "path 1→path 2→path 3→path 7→path 8→path 11→path 5→path 5→path 6 (reflection at the opening H2')". A total length in this case is obtained by "path 1×2+path 2×4+path 3×1+path 7×1+path 10×1". Yet another path is "path 1→path 2→path 3→path 7→path 8→path 11→path 5→path 4→path 4→path 5→path 6 (reflection at the opening H1')". A total length in this case is obtained by "path 1×2+path 2×4+path 3×1+path 7×3+path 10×1".

Yet another path is "path 1→path 2→path 3→path 7→path 8→path 8→path 8→path 11→path 6 (reflection at the opening H2)". A total length in this case is obtained by "path 1×2+path 2×4+path 3×1+path 7×1+path 10×1". Yet another path is "path 1→path 2→path 3→path 7→path 8→path 8→path 7→path 7→path 8→path 11→path 6 (reflection at the opening H1)". A total length in this case is obtained by "path 1×2+path 2×4+path 3×1+path 7×3+path 10×1".

Moreover, there is a pattern in which a reflection is performed at path 7 and path 8 and then a reflection is performed at path 5 and path 4. However, a total length provided by the pattern is very different from the total length of the primary path. Thus, a description thereof is omitted.

Next, the case in which the signal F is transmitted from the transmission probe 21 to the reception probe 22 through the opening H2, is considered.

A primary path with which a response output is obtained is "path 1→path 2→path 3→path 7→path 10→path 5→path 6". A total (path) length in this case is obtained by "path 1×2+path 2×2+path 3×1+path 7×1+path 10×1". Another path is "path 1→path 2→path 3→path 7→path 10→path 4→path 4→path 5→path 6 (reflection at the opening H1')". A total length in this case is obtained by "path 1×2+path 2×2+path 3×3+path 7×1+path 10×1".

Yet another path is "path 1→path 2→path 3→path 7→path 7→path 7→path 10→path 5→path 6 (reflection at the opening H3)". A total length in this case is obtained by "path 1×2+path 2×4+path 3×1+path 7×3+path 10×1". Yet another path is "path 1→path 2→path 3→path 7→path 8→path 8→path 10→path 5→path 6 (reflection at the opening H3)". A total length in this case is obtained by "path 1×2+path 2×4+path 3×1+path 7×1+path 10×1".

Yet another path is "path 1→path 2→path 3→path 7→path 10→path 5→path 5→path 5→path 6 (reflection at the opening H3')". A total length in this case is obtained by "path 1×2+path 2×6+path 7×1+path 10×1".

Yet another path is "path 1→path 2→path 3→path 7→path 8→path 8→path 10→path 4→path 4→path 5→path 6 (reflection at the opening H3 and the opening H1')". A total length in this case is obtained by "path 1×2+path 2×4+path 3×3+path 7×1+path 10×1". Yet another path is "path 1→path 2→path 3→path 7→path 7→path 7→path 10→path 4→path 4→path 5→path 6 (reflection at the opening H1 and the opening H1')". A total length in this case is obtained by "path 1×2+path 2×4+path 3×3+path 7×3+path 10×1".

Next, the case in which the signal F is transmitted from the transmission probe 21 to the reception probe 22 through the opening H1, is considered.

A primary path with which a response output is obtained is "path 1→path 2→path 3→path 9→path 4→path 5→path 6". A total (path) length in this case is obtained by "path 1×2+path 2×2+path 3×2+path 9×1". Another path is "path 1→path 2→path 3→path 7→path 7→path 9→path 4→path 5→path 6 (reflection at the opening H2). A total length in this case is obtained by "path 1×2+path 2×2+path 3×2+path 9×1+path 7×2".

Yet another path is "path 1→path 2→path 3→path 7→path 8→path 8→path 7→path 9→path 4→path 5→path 6 (reflection at the opening H3)". A total length in this case is obtained by "path 1×2+path 2×4+path 3×2+path 9×1+path 7×2". Yet another path is "path 1→path 2→path 3→path 9→path 4→path 4→path 4→path 5→path 6 (reflection at the opening H2')". A total length in this case is obtained by "path 1×2+path 2×2+path 3×3+path 9×1".

Yet another path is "path 1→path 2→path 3→path 9→path 4→path 5→path 5→path 4→path 4→path 5→path 6 (reflection at the opening H3')". A total length in this case is obtained by "path 1×2+path 2×4+path 3×3+path 9×1". Yet another path is "path 1→path 2→path 3→path 7→path 7→path 9→path 4→path 4→path 4→path 5→path 6 (reflection at the opening H2 and the opening H2')". A total length in this case is obtained by "path 1×2+path 2×2+path 3×4+path 9×1+path 7×2".

Moreover, there is also a path pattern in which the signal goes forward after being reflected off the openings H3 and H3'. However, a total length provided by the pattern is very different from the total length of the primary path. Thus, a description thereof is omitted.

Moreover, there is also a path pattern in which the signal enters the reception side from the transmission side, and then returns to the transmission side. However, a total length provided by the pattern is very different from the total length of the primary path. Thus, a description thereof is omitted.

When, as illustrated in FIG. 21, the six openings H1 to H3' described above are provided to the transmission probe 21 under the conditions that (portions before and after the folded section of) the transmission probe 21 and the reception probe 22 are arranged parallel to each other, and "path 1=path 6", "path 2=path 5=path 8", "path 3=path 4→path 7", and "path 10=path 11→path 9" are satisfied, the primary path passing through the opening H1 and the primary path passing through the opening H2 have equal propagation lengths, and this results in causing an error in measurement.

As described above, in the first to seventh embodiments, the transmission probe 21 and the reception probe 22 are configured such that a primary path and a path other than the primary path have different total lengths.

There are two openings in the first to fifth embodiments, and there are three openings in the sixth and seventh embodiments. The probes 21 and 22 may each include four or more openings each serving as a tiny antenna section, although a description thereof is omitted.

In the respective embodiments, a difference in path length between signal transmission paths of a plurality of signal transmission paths each passing through the openings (H1 to H3') is greater than or equal to a predetermined effective wavelength (2.06 cm). In the third, fourth, sixth, and seventh embodiments, the probes 21 and 22 are each arranged to be inclined with respect to the Z-axis direction such that a difference in path length between signal transmission paths is greater than or equal to a predetermined effective wavelength.

<Modifications>

The embodiments of the present technology have been described above. However, the present technology is not limited to the embodiments described above, and various modifications may be made thereto.

For example, the example of applying the present technology to the measurement of a water amount in soil where crops will grow, has been described in the embodiments above. Without being limited thereto, the present technology can also be applied to researches on a landslide and the measurement of, for example, a concentration of a different substance (such as fertilizer) of which relative permittivity is known.

The measurement target medium is not limited to soil, and may be a substance other than soil, such as livestock feed.

The water amount measurement apparatus 100 is configured to calculate relative permittivity using the characteristics of a propagation of an electromagnetic wave in a medium, and to calculate a water amount in the medium using the relative permittivity. Without being limited thereto, the water amount measurement apparatus 100 may be configured to directly calculate a water amount in the medium using the obtained characteristics of a propagation of an electromagnetic wave. For example, when the medium includes a relatively simple system, it is possible to create a correspondence table of the characteristics of a propagation of an electromagnetic wave and a water amount in the medium, and thus it is possible to directly obtain a water amount in the medium using the characteristics of a propagation of an electromagnetic wave by referring to the correspondence table.

Further, the sensor head may further include a temperature detector and/or an electrical conductivity detector.

The temperature detector can detect a temperature of a medium. For example, any temperature sensor such as a thermocouple or a thermistor can be adopted as the temperature detector. For example, the temperature detector is provided in the vicinity of the tiny antenna sections 221 and 222 for reception of the reception probe 22.

The electrical conductivity detector can detect electrical conductivity of a medium. For example, an appropriate conductivity or resistivity sensor such as a two-wire or four-wire one can be adopted as the electrical conductivity detector. For example, the electrical conductivity detector is provided in the vicinity of the tiny antenna sections 211 and 212 for transmission of the transmission probe 21.

It is known that the relative permittivity of a medium has a certain correlation with a temperature or the electrical conductivity of the medium. According to this example, not only the characteristics of a propagation of an electromagnetic wave in a medium, but also information regarding a temperature and the electrical conductivity of the medium can be acquired. Thus, a calculated value of the relative permittivity of a medium or a proportion of content by volume in the medium can be corrected for according to the acquired temperature information or electrical conductivity information. This results in being able to further improve the measurement accuracy.

Instead of, or in addition to the temperature detector and the electrical conductivity detector, a pH detector that can measure the pH of a medium may be provided to the sensor head.

Further, in the embodiments described above, the example in which the signal processing unit 50 includes a single information processing apparatus has been described above. Without being limited thereto, the signal processing unit 50 may include a computer system in which a plurality of computers operates cooperatively.

Note that the present technology may also take the following configurations.

(1) A sensor apparatus, including:
   a sensor head that includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe; and
   a measurement unit that includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception, in which
   the first probe and the second probe have different probe lengths, or a distance between the first tiny antenna section for transmission and the first tiny antenna section for reception, and a distance between the second tiny antenna section for transmission and the second tiny antenna section for reception are different from each other.

(2) The sensor apparatus according to (1), in which
   the first and second probes each include a coaxial cable that includes a core wire portion and a shield portion, and
   the first tiny antenna section for transmission, the second tiny antenna section for transmission, the first tiny antenna section for reception, and the second tiny antenna section for reception each include an opening that is provided to a portion of the shield portion.

(3) The sensor apparatus according to (1) or (2), in which
   the second probe includes a bent portion that is provided between the first tiny antenna section for reception and the second tiny antenna section for reception.

(4) The sensor apparatus according to (1) or (2), in which
   the first probe includes a fold portion,
   the first tiny antenna section for transmission is provided to the fold portion, and
   the second tiny antenna section for transmission is provided to a tip of the first probe.

(5) The sensor apparatus according to any one of (1) to (4), in which
   the sensor head further includes a support that supports the first probe and the second probe, and
   the first probe is supported by the support in a state in which the first probe is not parallel to the second probe.

(6) The sensor apparatus according to any one of (1) to (5), in which
   the first probe includes a third tiny antenna section for transmission,
   the second probe includes a third tiny antenna section for transmission, and
   the measurement unit generates the measurement signal further including information regarding characteristics of the propagation of the electromagnetic wave in the medium between the third tiny antenna section for transmission and the third tiny antenna section for reception.

(7) The sensor apparatus according to any one of (1) to (6), in which
   the sensor head includes a first signal-transmission path and a second signal-transmission path, the first signal-transmission path passing between the first tiny antenna section for transmission and the first tiny antenna section for reception, or between the first tiny antenna section for transmission and the second tiny antenna section for reception, the second signal-transmission path passing between the second tiny antenna section for transmission and the first tiny antenna section for reception, or between the second tiny antenna section for transmission and the second tiny antenna section for reception, and each of a difference in path length between the first signal-transmission paths, a difference in path length between the second signal-transmission paths, and a difference in path length between the first signal-transmission path and the second signal-transmission path, is greater than or equal to a predetermined effective wavelength.

(8) The sensor apparatus according to (7), in which the predetermined effective wavelength is greater than or equal to 2.06 cm.

(9) The sensor apparatus according to any one of (1) to (8), in which
arrangement of the first and second tiny antenna sections for transmission, and arrangement of the first and second tiny antenna sections for reception are asymmetric with respect to each other.

(10) A water amount measurement apparatus, including:
a sensor head that includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe;
a measurement unit that includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception; and
a signal processing unit that measures a water amount in the medium on the basis of the measurement signal, in which
the first probe and the second probe have different probe lengths, or a distance between the first tiny antenna section for transmission and the first tiny antenna section for reception, and a distance between the second tiny antenna section for transmission and the second tiny antenna section for reception are different from each other.

(11) The water amount measurement apparatus according to (10), in which
the signal processing unit includes
a delay time calculator that calculates, on the basis of the measurement signal, a delay time of the propagation of the electromagnetic wave between the first and second probes,
a relative permittivity calculator that calculates relative permittivity of the medium on the basis of the propagation delay time, and
a water amount calculator that calculates a water amount in the medium on the basis of the relative permittivity.

REFERENCE SIGNS LIST 10, 10A, 10B, 10C, 10D, 10E, 10F, 10G sensor apparatus
20, 20A, 20B, 20C, 20D, 20E, 20F, 20G sensor head
21 transmission probe
22 reception probe
23 tip
30 measurement unit
31 signal generator
50 signal processing unit
51 delay time calculator
52 relative permittivity calculator
53 water amount calculator
100 water amount measurement apparatus
210, 211, 212, 220, 221, 222 tiny antenna section
310 controller
H1, H1', H2, H2', H3, H3' opening

The invention claimed is:

1. A sensor apparatus, comprising:
a sensor head that includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe; and
a measurement unit that includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception, wherein
a distance between the first tiny antenna section for transmission and the first tiny antenna section for reception, and a distance between the second tiny antenna section for transmission and the second tiny antenna section for reception are different from each other,
the second probe includes a bent portion that is provided between the first tiny antenna section for reception and the second tiny antenna section for reception.

2. The sensor apparatus according to claim 1, wherein
the first and second probes each include a coaxial cable that includes a core wire portion and a shield portion, and
the first tiny antenna section for transmission, the second tiny antenna section for transmission, the first tiny antenna section for reception, and the second tiny antenna section for reception each include an opening that is provided to a portion of the shield portion.

3. The sensor apparatus according to claim 1, wherein
the sensor head further includes a support that supports the first probe and the second probe, and
the first probe is supported by the support in a state in which the first probe is not parallel to the second probe.

4. The sensor apparatus according to claim 1, wherein
the first probe includes a third tiny antenna section for transmission,
the second probe includes a third tiny antenna section for transmission, and
the measurement unit generates the measurement signal further including information regarding characteristics of the propagation of the electromagnetic wave in the medium between the third tiny antenna section for transmission and the third tiny antenna section for reception.

5. The sensor apparatus according to claim 1, wherein arrangement of the first and second tiny antenna sections for transmission, and arrangement of the first and second tiny antenna sections for reception are asymmetric with respect to each other.

6. A water amount measurement apparatus, comprising:
sensor apparatus according to claim 1; and
a signal processing unit that measures a water amount in the medium on a basis of the measurement signal.

7. The water amount measurement apparatus according to claim 6, wherein
the signal processing unit includes
a delay time calculator that calculates, on a basis of the measurement signal, a delay time of the propagation of the electromagnetic wave between the first and second probes,
a relative permittivity calculator that calculates relative permittivity of the medium on a basis of the propagation delay time, and
a water amount calculator that calculates a water amount in the medium on a basis of the relative permittivity.

8. A sensor apparatus, comprising:
a sensor head that includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe; and
a measurement unit that includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception, wherein
a distance between the first tiny antenna section for transmission and the first tiny antenna section for reception, and a distance between the second tiny antenna section for transmission and the second tiny antenna section for reception are different from each other,
the first probe includes a fold portion,
the first tiny antenna section for transmission is provided to the fold portion, and
the second tiny antenna section for transmission is provided to a tip of the first probe.

9. A water amount measurement apparatus, comprising:
the sensor apparatus according to claim 8; and
a signal processing unit that measures a water amount in the medium on a basis of the measurement signal.

10. The water amount measurement apparatus according to claim 9, wherein
the signal processing unit includes
a delay time calculator that calculates, on a basis of the measurement signal, a delay time of the propagation of the electromagnetic wave between the first and second probes,
a relative permittivity calculator that calculates relative permittivity of the medium on a basis of the propagation delay time, and
a water amount calculator that calculates a water amount in the medium on a basis of the relative permittivity.

11. A sensor apparatus, comprising:
a sensor head that includes a first probe and a second probe, the first probe including a first tiny antenna section for transmission and a second tiny antenna section for transmission, the second probe including a first tiny antenna section for reception and a second tiny antenna section for reception, the second probe being arranged at a predetermined distance from the first probe; and
a measurement unit that includes a controller that generates a measurement signal that includes information regarding characteristics of a propagation of an electromagnetic wave in a medium between the first tiny antenna section for transmission and the first tiny antenna section for reception, and information regarding characteristics of the propagation of the electromagnetic wave in the medium between the second tiny antenna section for transmission and the second tiny antenna section for reception, wherein
a distance between the first tiny antenna section for transmission and the first tiny antenna section for reception, and a distance between the second tiny antenna section for transmission and the second tiny antenna section for reception are different from each other,
the sensor head includes a first signal-transmission path and a second signal-transmission path, the first signal-transmission path passing between the first tiny antenna section for transmission and the first tiny antenna section for reception, or between the first tiny antenna section for transmission and the second tiny antenna section for reception, the second signal-transmission path passing between the second tiny antenna section for transmission and the first tiny antenna section for reception, or between the second tiny antenna section for transmission and the second tiny antenna section for reception, and
each of a difference in path length between the first signal-transmission paths, a difference in path length between the second signal-transmission paths, and a difference in path length between the first signal-transmission path and the second signal-transmission path, is greater than or equal to a predetermined effective wavelength.

12. The sensor apparatus according to claim 11, wherein the predetermined effective wavelength is greater than or equal to 2.06 cm.

13. A water amount measurement apparatus, comprising:
the sensor apparatus according to claim 11; and
a signal processing unit that measures a water amount in the medium on a basis of the measurement signal.

14. The water amount measurement apparatus according to claim 13, wherein
the signal processing unit includes
a delay time calculator that calculates, on a basis of the measurement signal, a delay time of the propagation of the electromagnetic wave between the first and second probes,
a relative permittivity calculator that calculates relative permittivity of the medium on a basis of the propagation delay time, and a water amount calculator that calculates a water amount in the medium on a basis of the relative permittivity.

\* \* \* \* \*